US012701887B2

(12) United States Patent
Tsukamoto et al.

(10) Patent No.: US 12,701,887 B2
(45) Date of Patent: Aug. 4, 2026

(54) DISPLAY DEVICE AND METHOD OF MANUFACTURING DISPLAY DEVICE

(71) Applicant: Sharp Display Technology Corporation, Kameyama City (JP)

(72) Inventors: Yuto Tsukamoto, Kameyama City (JP); Shinichi Kawato, Kameyama City (JP); Tokiyoshi Umeda, Kameyama City (JP); Tohru Sonoda, Kameyama City (JP)

(73) Assignee: Sharp Display Technology Corporation, Kameyama City (JP)

(*) Notice: Subject to any disclaimer, the term of this patent is extended or adjusted under 35 U.S.C. 154(b) by 401 days.

(21) Appl. No.: 18/571,534

(22) PCT Filed: Aug. 2, 2021

(86) PCT No.: PCT/JP2021/028658
§ 371 (c)(1),
(2) Date: Dec. 18, 2023

(87) PCT Pub. No.: WO2023/012877
PCT Pub. Date: Feb. 9, 2023

(65) Prior Publication Data
US 2024/0292702 A1 Aug. 29, 2024

(51) Int. Cl.
*H10K 59/35* (2023.01)
*H10K 39/34* (2026.01)
*H10K 59/12* (2023.01)

(52) U.S. Cl.
CPC ........... *H10K 59/353* (2023.02); *H10K 39/34* (2023.02); *H10K 59/1201* (2023.02)

(58) Field of Classification Search
CPC ........ H05B 33/10; H05B 33/12; H05B 33/14; H05B 33/26; H05B 33/28; H10K 39/34;
(Continued)

(56) References Cited

U.S. PATENT DOCUMENTS 12,178,062 B2 * 12/2024 Sun ...................... H10K 59/353
2024/0206215 A1 * 6/2024 Kida ...................... H10K 59/35

FOREIGN PATENT DOCUMENTS

CN 109076672 A * 12/2018 ............. H10K 59/35
CN 109791994 A * 5/2019 ............. H05B 33/12
(Continued)

*Primary Examiner* — Telly D Green
(74) *Attorney, Agent, or Firm* — ScienBiziP, P.C.

(57) ABSTRACT

A display device has a display area including a first pixel region, a second pixel region, and a third pixel region. The display device includes: a first electrode; a first photoelectric conversion layer including a first light-emitting layer, a second light-emitting layer, and a third light-emitting layer; a first electric charge injection layer; a second electric charge injection layer; a second photoelectric conversion layer including a fourth light-emitting layer; and a second electrode. The first light-emitting layer is provided in the first pixel region. The second light-emitting layer is provided in the second pixel region. The third light-emitting layer is provided in the third pixel region. The first electric charge injection layer is provided across the entire display area. The second electric charge injection layer is provided only in the third pixel region. The fourth light-emitting layer is provided at least in the third pixel region.

15 Claims, 18 Drawing Sheets

(58) Field of Classification Search
CPC .... H10K 50/00; H10K 59/00; H10K 59/1201; H10K 59/353
See application file for complete search history.

(56) References Cited

FOREIGN PATENT DOCUMENTS

| | | | | | |
|---|---|---|---|---|---|
| CN | 109791998 | A | * | 5/2019 | ............. H05B 33/28 |
| JP | 2013-073759 | A | | 4/2013 | |
| JP | 2013-073842 | A | | 4/2013 | |
| WO | WO-2018070348 | A1 | * | 4/2018 | ............. H05B 33/28 |

* cited by examiner

FORM RESIN LAYER ON SUPPORT SUBSTRATE — S1

FORM BARRIER LAYER — S2

FORM TFT LAYER — S3

FORM LIGHT-EMITTING ELEMENT LAYER — S4

FORM SEALING LAYER — S5

ATTACH TOP FACE FILM — S6

LIFT OFF SUPPORT SUBSTRATE — S7

ATTACH BOTTOM FACE FILM — S8

DIVIDE INTO INDIVIDUAL PIECES — S9

LIFT OFF TOP FACE FILM — S10

ATTACH FUNCTIONAL FILM — S11

MOUNT ELECTRONIC CIRCUIT BOARD — S12

DISPLAY DEVICE AND METHOD OF MANUFACTURING DISPLAY DEVICE

TECHNICAL FIELD

The disclosure relates to display devices and methods of manufacturing display devices.

BACKGROUND ART

Patent Literature 1 discloses a display device including a blue pixel that in turn includes: a pixel electrode; a first blue light-emitting layer; a charge generation layer; a second blue light-emitting layer; and an opposite electrode, which are provided in this order, wherein the second blue light-emitting layer is provided commonly to all pixels, and the charge generation layer is provided only in the blue pixel.

Patent Literature 2 discloses a display device including a blue pixel that in turn includes: a pixel electrode; a first blue light-emitting layer; a charge generation layer; a second blue light-emitting layer; and an opposite electrode, which are provided in this order, wherein the second blue light-emitting layer is provided only in the blue pixel, and the charge generation layer is provided commonly to all pixels.

CITATION LIST

Patent Literature

Patent Literature 1: Japanese Unexamined Patent Application Publication, Tokukai, No. 2013-73759

Patent Literature 2: Japanese Unexamined Patent Application Publication, Tokukai, No. 2013-73842

SUMMARY

Technical Problem

The structures disclosed in Patent Literatures 1 and 2 have a problem that the display device exhibits low current consumption efficiency because of decreases in the luminous efficiency of the red and green pixels.

In the structure disclosed in Patent Literature 1, the second blue light-emitting layer is formed directly on the red light-emitting layer and the green light-emitting layer. Therefore, the recombination of electrons and holes in the red and green pixels partially occurs in the second blue light-emitting layer, As a result, the electrons and holes that recombine in the red light-emitting layer and the green light-emitting layer decrease, which reduces the luminous efficiency of the red and green pixels.

In the structure disclosed in Patent Literature 2, electrons and holes are generated in the charge generation layer provided in the red and green pixels, and some of these electrons and holes recombine in the charge generation layer. As a result, there occurs current loss in the red and green pixels, which reduces the luminous efficiency of the red and green pixels.

The present disclosure, in one aspect thereof, has an object to provide a display device that exhibits high current consumption efficiency and that allows for high productivity.

Solution to Problem

To address these issues, a display device in accordance with the present disclosure is a display device having a display area including a first pixel region, a second pixel region, and a third pixel region, the display device including: a first electrode; a first photoelectric conversion layer including a first light-emitting layer that emits light of a first color, a second light-emitting layer that emits light of a second color that differs from the first color, and a third light-emitting layer that emits light of a third color that differs from the first color and the second color; a first electric charge injection layer having an opposite polarity from the first electrode; a second electric charge injection layer having a same polarity as the first electrode; a second photoelectric conversion layer including a fourth light-emitting layer that emits light of the third color; and a second electrode having an opposite polarity from the first electrode, wherein the first light-emitting layer is provided in the first pixel region, the second light-emitting layer is provided in the second pixel region, the third light-emitting layer is provided in the third pixel region, the first electric charge injection layer is provided across the entire display area, the second electric charge injection layer is provided only in the third pixel region, and the fourth light-emitting layer is provided at least in the third pixel region.

The display device according to the present disclosure may be configured such that the fourth light-emitting layer is provided across the entire display area.

The display device according to the present disclosure may be configured such that the second photoelectric conversion layer further includes a charge transport layer disposed between the second electric charge injection layer and the fourth light-emitting layer and having a same polarity as the second electric charge injection layer, and the charge transport layer is provided at least in the third pixel region.

The display device according to the present disclosure may be configured such that the charge transport layer is provided across the entire display area.

The display device according to the present disclosure may be configured so as to further include an electrically conductive transparent film between the first electric charge injection layer and the second electric charge injection layer, wherein the electrically conductive transparent film is provided at least in the first pixel region and the second pixel region.

The display device according to the present disclosure may be configured such that the electrically conductive transparent film is provided across the entire display area.

The display device according to the present disclosure may be configured such that either one of the first electrode and the second electrode includes a transparent electrode, and another one of the first electrode and the second electrode includes a reflective electrode.

The display device according to the present disclosure may be configured such that the first electrode and the second electrode each include a transparent electrode.

The display device according to the present disclosure may be configured such that the first light-emitting layer has an emission wavelength that differs from an absorption wavelength of the fourth light-emitting layer, and the second light-emitting layer has an emission wavelength that differs from the absorption wavelength of the fourth light-emitting layer.

The display device according to the present disclosure may be configured such that the third light-emitting layer has a luminous efficiency that is lower than a luminous efficiency of the first light-emitting layer and a luminous efficiency of the second light-emitting layer.

The display device according to the present disclosure may be configured such that the first electric charge injection layer contains a metal material.

The display device according to the present disclosure may be configured such that the second electric charge injection layer contains only an organic material.

The display device according to the present disclosure may be configured such that each layer from the first light-emitting layer to the fourth light-emitting layer contains quantum dots that emit light upon being excited by recombination of holes and electrons.

The display device according to the present disclosure may be configured such that each layer from the first light-emitting layer to the fourth light-emitting layer contains an organic material that emits light upon being excited by recombination of holes and electrons.

To address these issues, a method of manufacturing a display device in accordance with the present disclosure is a method of manufacturing a display device having a display area including a first pixel region, a second pixel region, and a third pixel region, the method including: a first electrode formation step of forming a first electrode; a first photoelectric conversion layer formation step of forming a first photoelectric conversion layer including a first light-emitting layer that emits light of a first color, a second light-emitting layer that emits light of a second color that differs from the first color, and a third light-emitting layer that emits light of a third color that differs from the first color and the second color; a first electric charge injection layer formation step of forming a first electric charge injection layer having an opposite polarity from the first electrode; a second electric charge injection layer formation step of forming a second electric charge injection layer having a same polarity as the first electrode; a second photoelectric conversion layer formation step of forming a second photoelectric conversion layer including a fourth light-emitting layer; and a second electrode formation step of forming a second electrode having an opposite polarity from the first electrode, wherein the first photoelectric conversion layer formation step provides the first light-emitting layer in the first pixel region, the second light-emitting layer in the second pixel region, and the third light-emitting layer in the third pixel region, the first electric charge injection layer formation step provides the first electric charge injection layer across the entire display area, the second electric charge injection layer formation step provides the second electric charge injection layer only in the third pixel region, and the second photoelectric conversion layer formation step provides the fourth light-emitting layer at least in the third pixel region.

Advantageous Effects of Disclosure

The present disclosure, in one aspect thereof, can provide a display device that exhibits high current consumption efficiency and that allows for high productivity.

DESCRIPTION OF EMBODIMENTS

Embodiment 1

Method of Manufacturing Display Device and Structure of Display Device

Figure 1:
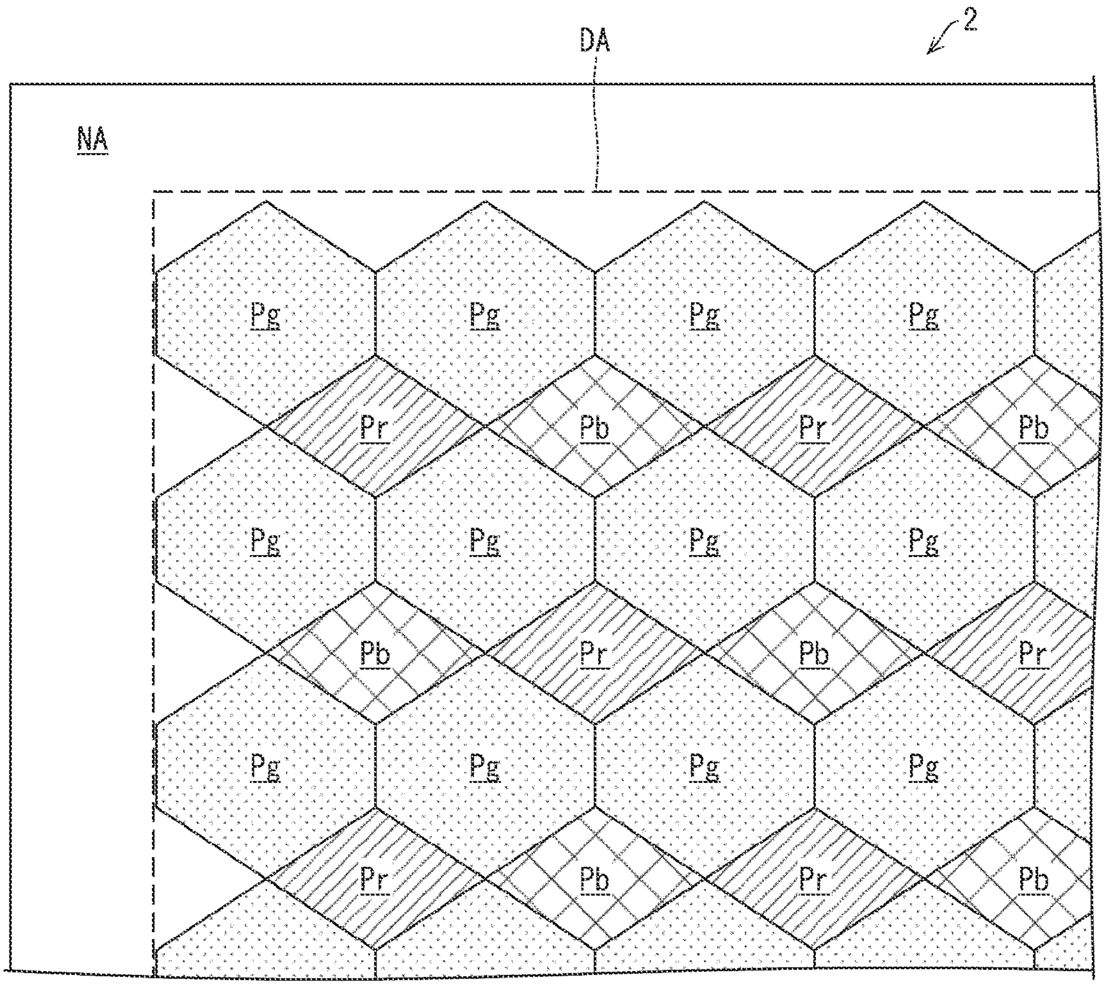
FIG. 1 is a partial schematic plan view of a non-limiting example of a structure of a display device in accordance with an embodiment of the present disclosure.

FIG. 1 is a partial schematic plan view of a non-limiting example of a structure of a display device in accordance with Embodiment 1 of the present disclosure.

Referring to FIG. 1, a display device 2 has a display area DA and a frame area NA surrounding the display area DA. The display area DA includes red subpixels Pr (first pixel regions) that emit red light, green subpixels Pg (second pixel regions) that emit green light, and blue subpixels Pb (third pixel regions) that emit blue light. Throughout the following, the red subpixels Pr, the green subpixels Pg, and the blue subpixels Pb may be collectively referred to as subpixels.

Throughout the following description, expressions like "component A is in the same layer as component B" indicate that components A and B are formed in a single process or step (film formation step), expressions like "component A underlies/is below component B" indicate that component A is formed in an earlier process or step than component B, and expressions like "component A overlies/is on/is above component B" indicate that component A is formed in a later process or step than component B.

Figure 2:
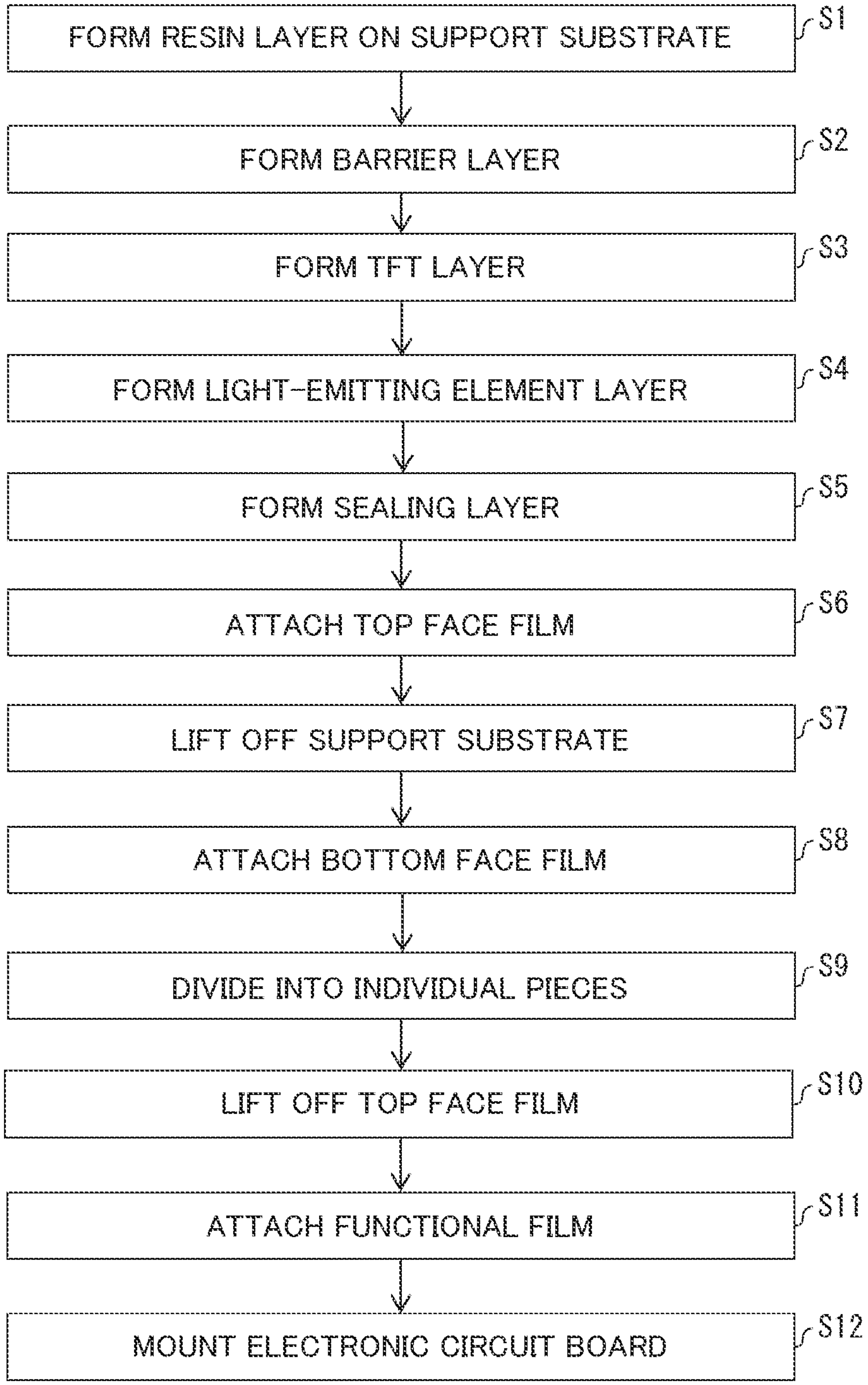
FIG. 2 is a flow chart representing a non-limiting example of a method of manufacturing a display device in accordance with an embodiment of the present disclosure.
Figure 3:
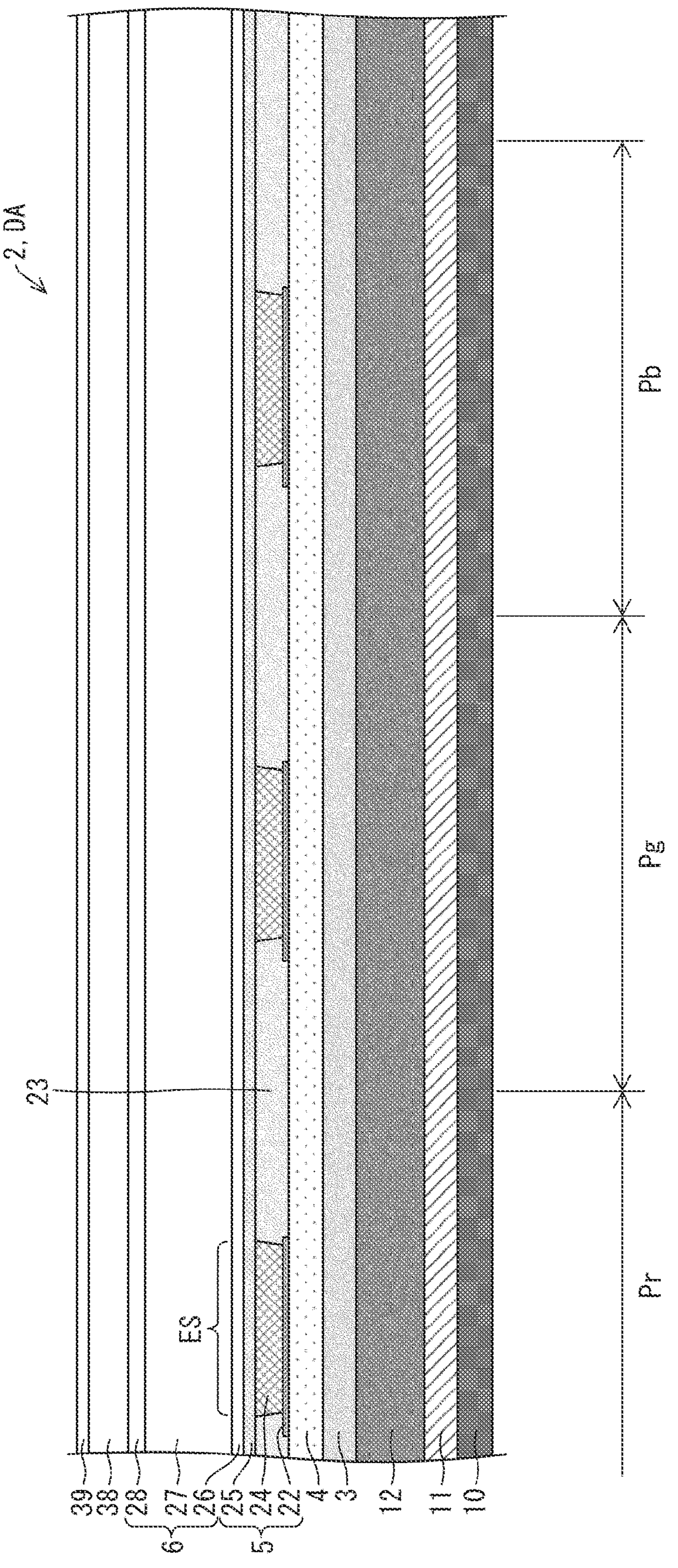
FIG. 3 is a schematic cross-sectional view of a non-limiting example of a structure of a display area of a display device in accordance with an embodiment of the present disclosure.

FIG. 2 is a flow chart representing a non-limiting example of a method of manufacturing the display device 2. FIG. 3 is a schematic cross-sectional view of a non-limiting example of a structure of the display area DA of the display device 2.

To manufacture the flexible display device 2, referring to FIGS. 2 and 3, first, a resin layer 12 is formed on a translucent support substrate (e.g., mother glass) (step S1). Next, a barrier layer 3 is formed (step S2). Next, a thin film transistor layer 4 (TFT layer) is formed (step S3). Next, a light-emitting element layer 5 is formed (step S4). Next, a sealing layer 6 is formed (step S5). Next, a top face film is attached onto the sealing layer 6 via an adhesive layer (step S6).

Next, the support substrate is lifted off the resin layer 12 by, for example, laser irradiation (step S7). Next, a bottom face film 10 is attached onto a bottom face of the resin layer 12 via an adhesive layer 11 (step S8). Next, a stack body including the bottom face film 10, the adhesive layer 11, the resin layer 12, the barrier layer 3, the thin film transistor layer 4, the light-emitting element layer 5, and the sealing layer 6 is divided together with the top face film to obtain a plurality of individual pieces (step S9). Next, the top face film is lifted off from the resultant individual pieces (step S10), and a functional film 39 is attached onto the sealing layer 6 of the individual piece via an adhesive layer 38 (step S11). Next, an electronic circuit board (e.g., IC chip and FPC) is mounted to a portion (terminal section) of the frame area (non-display area) surrounding the display area in which the plurality of subpixels are formed (step S12). Note that steps S1 to S12 are performed by a display device manufacturing equipment (including film-forming machines that perform steps S1 to S5).

The light-emitting element layer 5 includes: a pixel electrode 22 overlying the thin film transistor layer 4; an insulating edge cover 23 covering the edges of the pixel electrode 22; an electroluminescent layer 24 overlying the edge cover 23; and a common electrode 25 overlying the electroluminescent layer 24.

Each subpixel includes a light-emitting element ES (electroluminescent element) in the light-emitting element layer 5 and a subpixel circuit for controlling the light-emitting element ES in the thin film transistor layer 4. The light-emitting element ES includes one of the insular pixel electrodes 22, the electroluminescent layer 24, and the common electrode 25 and is either an organic light-emitting diode (OLED) or a quantum-dot light-emitting diode (QLED).

The sealing layer 6 is translucent and includes: an inorganic sealing film 26 covering the common electrode 25; an organic buffer film 27 overlying the inorganic sealing film 26; and an inorganic sealing film 28 overlying the organic buffer film 27. The sealing layer 6, which covers the light-emitting element layer 5, prevents the permeation of water, oxygen, and other foreign objects into the light-emitting element layer 5.

The functional film 39 may include, for example, a polarizer film, a flexible touch panel, and a protective film.

The description has so far discussed a flexible display device. To manufacture a non-flexible display device, the process proceeds, for example, to step S9 after the glass substrate is subjected to stacking steps S2 to S5 because it is generally unnecessary to, for example, form a resin layer and replace the base member. In addition, in manufacturing a non-flexible display device, a translucent sealing member may be adhered using adhesive sealant in a nitrogen atmosphere, instead of, or in addition to, the formation of the sealing layer 6. The translucent sealing member may be made of, for example, glass or plastic.

Structure of Light-Emitting Element Layer

Figure 4:
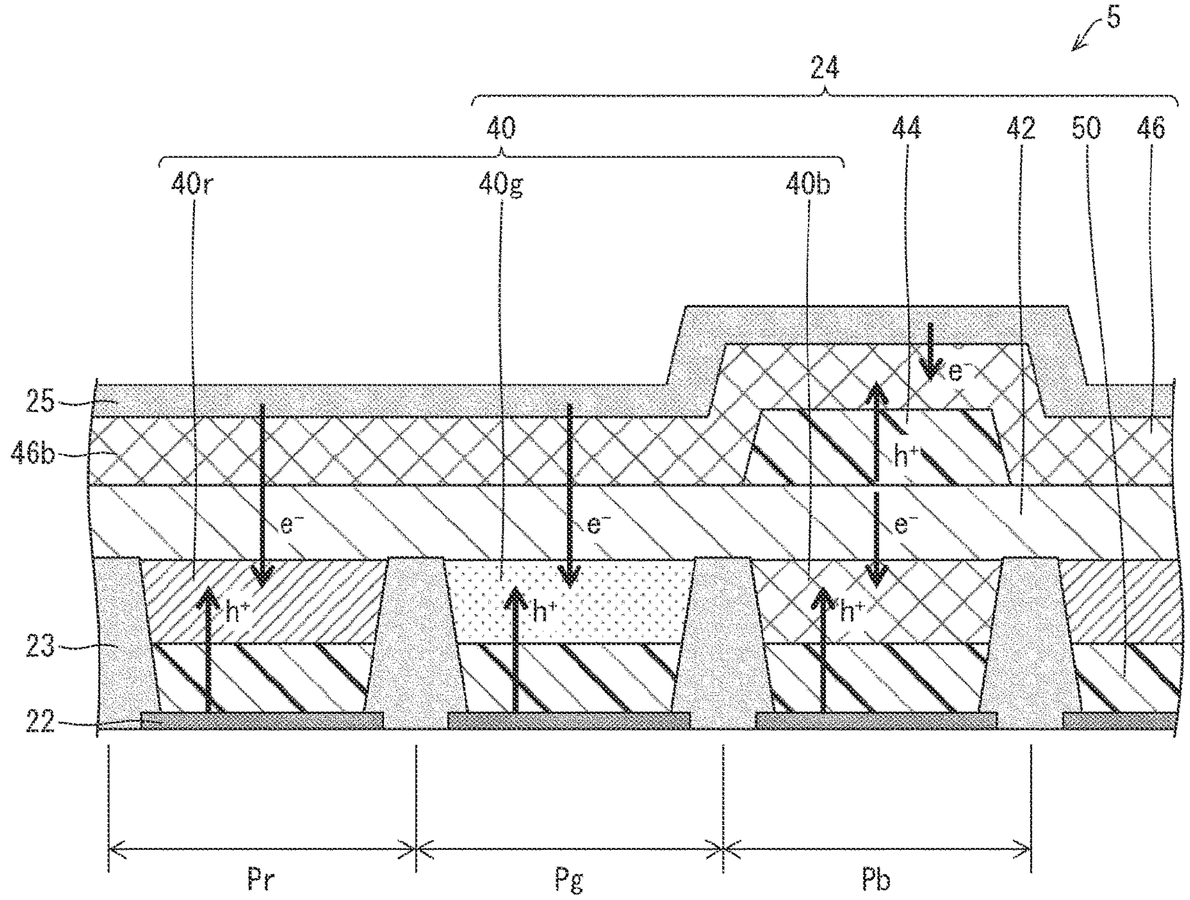
FIG. 4 is a schematic cross-sectional view of a non-limiting example of a structure of a light-emitting element layer in a display area in accordance with an embodiment of the present disclosure.

FIG. 4 is a schematic cross-sectional view of a non-limiting example of a structure of the light-emitting element layer 5 in the display area DA in accordance with the present embodiment. In the present embodiment, the pixel electrode 22 is an anode, and the common electrode 25 is a cathode.

Referring to FIG. 4, the light-emitting element layer 5 includes: the pixel electrode 22 (first electrode); a first hole injection layer 50 having the same polarity as the pixel electrode 22; a first photoelectric conversion layer 40; an electron injection layer 42 (first electric charge injection layer) having an opposite polarity from the pixel electrode 22; a second hole injection layer 44 (second electric charge injection layer) having the same polarity as the pixel electrode 22; a second photoelectric conversion layer 46; and the common electrode 25 (second electrode) having an opposite polarity from the pixel electrode 22, which are provided in this order. Here, the first photoelectric conversion layer 40 includes: a red light-emitting layer 40*r* (first light-emitting layer) that emits red (first color) light; a green light-emitting layer 40*g* (second light-emitting layer) that emits green (second color) light; and a first blue light-emitting layer 40*b* (third light-emitting layer) that emits blue (third color) light. The second photoelectric conversion layer 46 contains a second blue light-emitting layer 46*b* (fourth light-emitting layer) that emits blue light.

The light-emitting element layer 5 may further include additional layers (not shown). These additional layers may include, for example, a hole transport layer between the first hole injection layer 50 and the first photoelectric conversion layer 40, an electron transport layer between the first photoelectric conversion layer 40 and the electron injection layer 42, and an electron transport layer and/or an electron injection layer between the second photoelectric conversion layer 46 and the common electrode 25.

In the present disclosure, "having an opposite polarity from the pixel electrode 22" indicates that the component injects or transports electric charge that has an opposite polarity from the electric charge that is injected to the first photoelectric conversion layer 40 by the pixel electrode 22. On the other hand, "having the same polarity as the pixel electrode 22" indicates that the component injects or transports electric charge that has the same polarity as the electric charge that is injected to the first photoelectric conversion layer 40 by the pixel electrode 22. Since the pixel electrode 22 is an anode, those components "having an opposite polarity from the pixel electrode 22" are cathodes, electron transport layers, and electron injection layers. On the other hand, those components "having the same polarity as the pixel electrode 22" are anodes, hole transport layers, and hole injection layers.

Electrode

Either one of the pixel electrode 22 and the common electrode 25 may include a transparent electrode, whereas the other may include a reflective electrode. When the display device 2 is a single-face display device of a top-emission type, the lower electrode, in other words, the pixel electrode 22, includes a reflective electrode, whereas the upper electrode, in other words, the common electrode 25 includes a transparent electrode. When the display device 2 is a single-face display device of a bottom-emission type, the pixel electrode 22 includes a transparent electrode, whereas the common electrode 25 includes a reflective electrode. Alternatively, the pixel electrode 22 and the common electrode 25 may each include a transparent electrode. When the display device 2 is a double-face display device, the pixel electrode 22 and the common electrode 25 each includes a transparent electrode.

In the present disclosure, a "transparent electrode" is a conductive layer that transmits light and may be a translucent electrode. A "reflective electrode" is a conductive layer that reflects light.

The transparent electrode may be made of a transparent metal such as ITO (indium tin oxide), IZO (indium zin oxide), or indium gallium zin oxide. Alternatively, the transparent electrode may include a film of aluminum or a like non-transparent metal that is sufficiently thin as to allow transmission of light. When the anode is a transparent electrode, for example, the anode may be made of an approximately 50-nm film of ITO. When the cathode is a transparent electrode, for example, the cathode may be mode of an approximately 20-nm film of an alloy containing Mg and Ag.

The reflective electrode may include a film of aluminum or a like non-transparent metal that is sufficiently thick as to allow reflection of light. The reflective electrode may include a stack of a transparent metal and a non-transparent metal. When the anode is a reflective electrode, for example, the anode may include a stack of a film of an approximately 10-nm transparent metal, an approximately 100-nm film pf a Ag-containing alloy, and an approximately 10-nm film of a transparent metal, which are provided in this order. When the cathode is a reflective electrode, for example, the cathode may include an approximately 100-nm film of a Mg- and Ag-containing alloy or Al.

Light-Emitting Layer

The red light-emitting layer **40*r* contains a light-emitting material that is excited by the recombination of holes and electrons to emit red light. The red light-emitting layer 40*r* may contain a charge transport material such as a CBP compound. The red light-emitting layer 40*r*** is provided in the red subpixel Pr, not in the green subpixel Pg and the blue subpixel Pb.

The green light-emitting layer **40*g* contains a light-emitting material that is excited by the recombination of holes and electrons to emit green light. The green light-emitting layer 40*g* may contain a charge transport material such as a CBP compound. The green light-emitting layer 40*g*** is provided in the green subpixel Pg, not in the red subpixel Pr and the blue subpixel Pb.

Each of the first blue light-emitting layer **40*b* and the second blue light-emitting layer 46*b* contains a light-emitting material that is excited by the recombination of holes and electrons to emit blue light. Each of the first blue light-emitting layer 40*b* and the second blue light-emitting layer 46*b* may contain a charge transport material such as a CBP compound. The first blue light-emitting layer 40*b* is provided in the blue subpixel Pb, not in the green subpixel Pg and the red subpixel Pr. Meanwhile, the second blue light-emitting layer 46*b* is provided at least in the blue subpixel Pb, and not necessarily in the green subpixel Pg and the red subpixel Pr. The second blue light-emitting layer 46*b*** is preferably provided across the entire display area DA with a view to reducing patterning for improved productivity.

The first blue light-emitting layer **40*b* and the second blue light-emitting layer 46*b* may have either the same structure or different structures. When the first blue light-emitting layer 40*b* and the second blue light-emitting layer 46*b* have different structures, preferably, the first blue light-emitting layer 40*b* has an emission wavelength that differs from the absorption wavelength of the second blue light-emitting layer 46*b*, and the second blue light-emitting layer 46*b* has an emission wavelength that differs from the absorption wavelength of the first blue light-emitting layer 40*b***, to prevent decreases in the luminous efficiency of the blue subpixel Pb.

When the second blue light-emitting layer **46*b* is provided also in the red subpixel Pr, the red light-emitting layer 40*r* preferably has an emission wavelength that differs from the absorption wavelength of the second blue light-emitting layer 46*b*, for the purposes of preventing decreases in the luminous efficiency of the red subpixel Pr and preventing color mixing. When the second blue light-emitting layer 46*b* is provided also in the green subpixel Pg, the green light-emitting layer 40*g* preferably has an emission wavelength that differs from the absorption wavelength of the second blue light-emitting layer 46*b***, for the same purposes.

Each light-emitting material, for example, when the display device 2 is of a QLED type, contains quantum dots. Each light-emitting material, for example, when the display device 2 is of an OLED type, contains an organic material.

As an example, when the display device 2 is of an OLED type, the light-emitting material for the red light-emitting layer **40*r* may include bis(2-benzo[b]thiophen-2-yl-pyridine)(acetylacetonate) iridium (III) (common name: "Ir (btp)2(acac)"), the light-emitting material for the green light-emitting layer 40*g* may include tris(2-phenylpyridine) iridium (III) (common name: "Ir (ppy) 3"), and the light-emitting material for the first blue light-emitting layer 40*b* and the second blue light-emitting layer 46*b*** may include bis(3,5-difluoro-2-(2-pyridyl)phenyl-(2-carboxypyridyl) iridium (III) (common name: "FIrPic").

Charge Generation Layer

The electron injection layer 42 contains an electron injection material to inject electrons to the first photoelectric conversion layer 40. The electron injection layer 42 disrupts transport of holes. The electron injection layer 42 is provided across the entire display area DA. The electron-injecting inorganic material may include a metal element such as an alkali metal, an alkali earth metal, or a rare earth metal. The electron-injecting inorganic material include, for example, Li. The electron-injecting organic material includes, for example, 4,7-diphenyl-1,10-phenanthroline (common name: "Bphen").

The first hole injection layer 50 contains a hole injection material to inject holes to the first photoelectric conversion layer 40. The second hole injection layer 44 contains a hole injection material to inject holes to the second photoelectric conversion layer 46. The first hole injection layer 50 and the second hole injection layer 44 disrupt transport of electrons. The first hole injection layer 50 is provided either across the entire display area DA or in each of the red subpixel Pr, the green subpixel Pg, and the blue subpixel Pb. On the other hand, the second hole injection layer 44 is provided only in the blue subpixel Pb. The hole-injecting organic material includes, for example, dipyrazinoquinoxalinehexacarbonitrile (common name: "HAT-CN", structural formula is shown below), a α-naphthyl substituted diamine derivative (common name: "α-NPD"), and tetrafluorotetracyanoquinodimethane (common name: "F4-TCNQ"), and copper phthalocyanine (common name: "CuPc"). These organic materials have such a low vapor deposition temperature (400° degrees Celsius or below) as to be suitably used for vapor deposition using a fine metal mask (FMM). The hole-injecting inorganic material includes, for example, vanadium oxide and molybdenum oxide.

[Chem. 1]

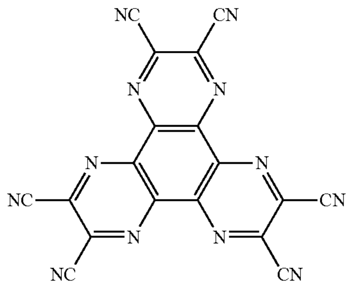

The material for the electroluminescent layer 24 is selected so that (i) a charge generation layer can be formed in the blue subpixels, but that (ii) no charge generation layer is formed in the red subpixels Pr and in the green subpixels Pg.

Figure 5:
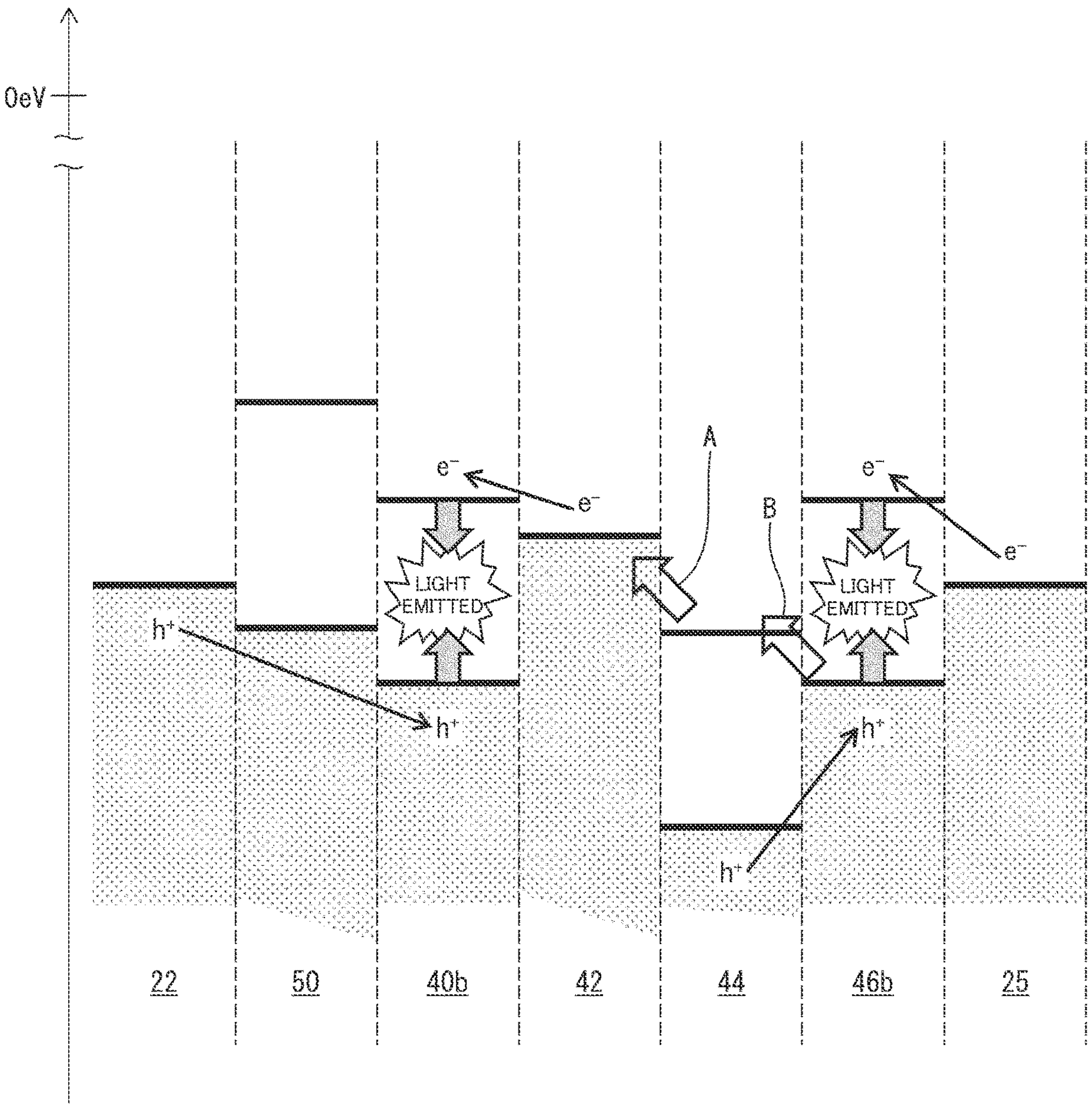
FIG. 5 is a schematic view of a non-limiting example of the energy level of electrons in a blue subpixel in a light-emitting element layer shown in FIG. 4.
Figure 6:
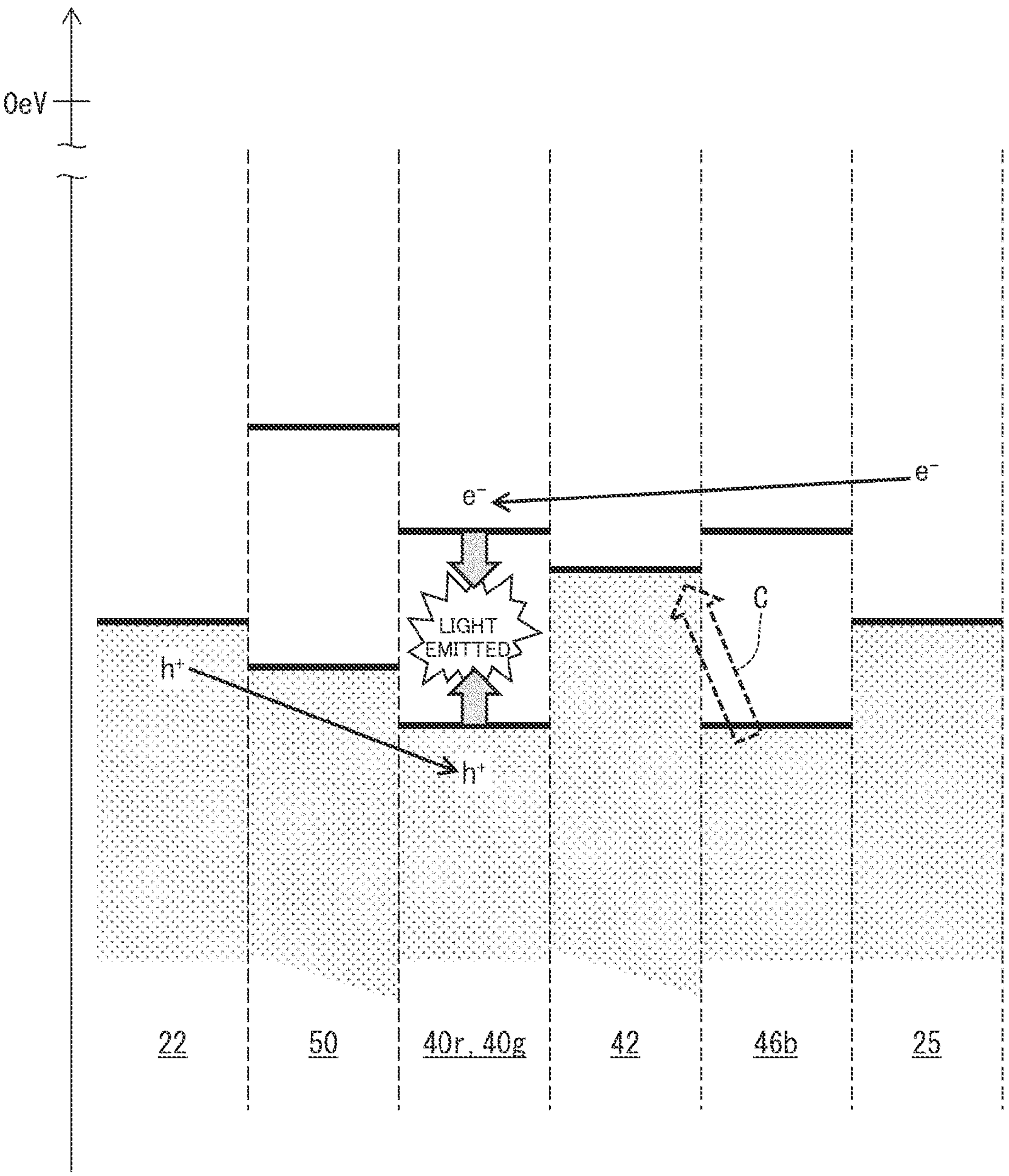
FIG. 6 is a schematic view of a non-limiting example of the energy level of electrons in a red subpixel and a green subpixel in the light-emitting element layer shown in FIG. 4.

FIG. 5 is a schematic view of a non-limiting example of the energy level of electrons the blue subpixel Pb of the light-emitting element layer 5 shown in FIG. 4. FIG. 6 is a schematic view of a non-limiting example of the energy level of electrons in the red subpixel Pr and the green subpixel Pg in the light-emitting element layer 5 shown in FIG. 4.

FIG. 5 shows: the Fermi level of the pixel electrode 22, the highest occupied molecular orbital (HOMO) and the lowest unoccupied molecular orbital (LUMO) of the first hole injection layer 50, the HOMO and the LUMO of the first blue light-emitting layer 40*b*, the Fermi level of the electron injection layer 42, the HOMO and the LUMO of the second hole injection layer 44, the HOMO and the LUMO of the second blue light-emitting layer 46*b*, and the Fermi level of the common electrode 25, all in solid lines.

FIG. 6 shows the Fermi level of the pixel electrode 22, the HOMO and the LUMO of the first hole injection layer 50, the HOMO and the LUMO of the red light-emitting layer 40*r* or the green light-emitting layer 40*g*, the Fermi level of the electron injection layer 42, the HOMO and the LUMO of the second blue light-emitting layer 46*b*, and the Fermi level of the common electrode 25, all in solid lines.

Here, the Fermi level of the electron injection layer 42 refers to the Fermi level of a metal element in the electron injection layer 42. For example, when the electron injection layer 42 contains Li, the Fermi level of the electron injection layer 42 refers to the Fermi level of lithium.

FIGS. 5 and 6 show orbitals below the Fermi level or the LUMO, in other words, valence bands, in hatching. FIGS. 5 and 6 do not show the depletion layer and the curvature of orbital levels that occur at or near an interface between layers. In FIGS. 5 and 6, the vacuum energy level is 0 eV.

Referring to FIG. 5, first of all, in the blue subpixel Pb, materials are selected for the electron injection layer 42, the second hole injection layer 44, and the second blue light-emitting layer 46*b* in such a manner that electrons can be easily withdrawn from the conduction band of the second hole injection layer 44 to the conduction band of the electron injection layer 42 (arrow A) and/or that electrons can be easily withdrawn from the valence band of the second blue light-emitting layer 46*b* to the conduction band of the second hole injection layer 44 (arrow B).

For instance, the hole transport material contained in the second hole injection layer 44 is preferably CuPc or a like material from which electrons are easily withdrawn, so as to facilitate the withdrawal of electrons from the second hole injection layer 44 to the electron injection layer 42 (arrow A). Furthermore, to facilitate such withdrawal (arrow A), the energy difference between the Fermi level of the electron injection layer 42 and the LUMO of the second hole injection layer 44 is preferably sufficiently small. At operating temperatures of the display device 2, some electrons are excited by thermal energy from the valence band to the conduction band, producing holes in the valence band. As these thermally excited electrons are withdrawn from the second hole injection layer 44 to the electron injection layer 42 (arrow A), holes are produced in the valence band of the second hole injection layer 44 and injected to the valence band of the second blue light-emitting layer 46*b*. When this is the case, the HOMO of the second blue light-emitting layer 46*b* is preferably positioned between the HOMO of the second hole injection layer 44 and the vacuum energy level so as to facilitate the injection of holes to the second blue light-emitting layer 46*b*.

For instance, the hole injection material contained in the second hole injection layer 44 is preferably HAT-CN or a like hole injection material from which electrons are easily withdrawn, so as to facilitate the withdrawal of electrons from the second blue light-emitting layer 46*b* to the second hole injection layer 44 (arrow B). Furthermore, to facilitate such withdrawal (arrow B), the energy difference between the LUMO of the second hole injection layer 44 and the HOMO of the second blue light-emitting layer 46*b* is preferably sufficiently small. These withdrawn electrons are further transported to the conduction band of the electron injection layer 42. When this is the case, the energy difference between the LUMO of the second hole injection layer 44 and the Fermi level of the electron injection layer 42 is preferably sufficiently small as to facilitate the transport of electrons to the electron injection layer 42.

Then, the electron injection layer 42 receives electrons from the second hole injection layer 44 to supply the electrons to the conduction band of the first blue light-emitting layer 40*b*. Therefore, the energy difference between the Fermi level of the electron injection layer 42 and the LUMO of the first blue light-emitting layer 40*b* is preferably sufficiently small as to facilitate the injection of electrons from the electron injection layer 42 to the first blue light-emitting layer 40*b*.

As described in the foregoing, holes are injected from the second hole injection layer 44 to the second blue light-emitting layer 46*b*. Then, electrons are injected from the electron injection layer 42 to the first blue light-emitting layer 40*b*. Therefore, in the blue subpixel Pb, the combination of the electron injection layer 42 and the second hole injection layer 44 functions as a charge generation layer, enabling the second blue light-emitting layer 46*b* to emit light.

Referring to FIG. 6, secondly, in the red subpixel Pr and the green subpixel Pg, materials are selected for the electron injection layer 42 and the second blue light-emitting layer 46*b* in such a manner that electrons cannot be easily withdrawn from the valence band of the second blue light-emitting layer **46*b* to the conduction band of the electron injection layer 42 (arrow C). Specifically, these materials are selected so that (i) the Fermi level of the electron injection layer 42 is positioned between the vacuum energy level and the HOMO of the second blue light-emitting layer 46*b* and also that (ii) the energy difference between the Fermi level of the electron injection layer 42 and the HOMO of the second blue light-emitting layer 46*b* is sufficiently large. When this is the case, the energy barrier is so high that electrons are not so easily withdrawn as to produce holes in the valence band of the second blue light-emitting layer 46*b*** (arrow C).

Therefore, the electron injection layer 42 does not inject holes to the second blue light-emitting layer **46*b*, and the electrons injected from the common electrode 25 to the second blue light-emitting layer 46*b* are injected to the red light-emitting layer 40*r* or the green light-emitting layer 40*g* via the second blue light-emitting layer 46*b* and the electron injection layer 42. Therefore, no charge generation layer is formed in the red subpixel Pr and the green subpixel Pg, which prohibits the second blue light-emitting layer 46*b*** from emitting light.

As a result of this, no current loss that is attributable to the charge generation layer occurs in the red subpixel Pr and the green subpixel Pg. Therefore, the current consumption efficiency of the red subpixel Pr and the green subpixel Pg in the display device 2 is higher than in the known structure where such current loss can occur (e.g., the structure disclosed in Patent Literature 2).

In addition, since there is no charge generation layer, the second photoelectric conversion layer 46 does not emit light in the red subpixel Pr and the green subpixel Pg even when those portions of the second photoelectric conversion layer 46 that correspond to the red subpixel Pr and the green subpixel Pg include a light-emitting layer other than the second blue light-emitting layer **46*b*. Therefore, the portions of the second photoelectric conversion layer 46 that correspond to the red subpixel Pr and the green subpixel Pg may include a light-emitting layer other than the second blue light-emitting layer 46*b***.

In addition, in the red subpixel Pr and the green subpixel Pg, the holes injected from the pixel electrode 22 and the electrons injected from the common electrode 25 recombine in the first photoelectric conversion layer 40. Furthermore, the holes injected from the pixel electrode 22 are blocked by the electron injection layer 42 and hardly reach the second blue light-emitting layer **46*b*. Therefore, in the red subpixel Pr, the red light-emitting layer 40*r* emits light, whereas the second blue light-emitting layer 46*b* practically dose not emit light. In the green subpixel Pg, the green light-emitting layer 40*g* emits light, whereas the second blue light-emitting layer 46*b* practically does not emit light. Therefore, the red subpixel Pr and the green subpixel Pg in the display device 2** are less likely to cause color mixing than in the known structure where the blue light-emitting layers in the red subpixel and the green subpixel are allowed to emit light (e.g., the structure disclosed in Patent Literature 1).

Meanwhile, in the blue subpixel Pb, the holes injected from the pixel electrode 22 and the electrons injected from the electron injection layer 42 recombine in the first photoelectric conversion layer 40, and the holes injected from the second hole injection layer 44 and the electrons injected from the common electrode 25 recombine in the second photoelectric conversion layer 46. Therefore, in the blue subpixel Pb, both the first blue light-emitting layer **40*b* and the second blue light-emitting layer 46*b* emit light. In other words, the light-emitting element ES in the blue subpixel Pb is a tandem-type light-emitting element. Therefore, the blue subpixel Pb in the display device 2** exhibits a higher current consumption efficiency than a known structure that includes no tandem-type light-emitting element.

In addition, as described above, the luminous efficiency of the first blue light-emitting layer **40*b* is lower than the luminous efficiency of the red light-emitting layer 40*r* and the green light-emitting layer 40*g*. The emission of light by the second blue light-emitting layer 46*b* increases the sum of the luminous efficiency in the blue subpixel Pb. Hence, the current consumption efficiency of the display device 2 is efficiently improved. Furthermore, the amount of current that needs to be fed to the blue subpixel Pb to achieve an equal luminance across the red subpixel Pr, the green subpixel Pg, and the blue subpixel Pb decreases over the amount of current in a known structure where the light-emitting element ES in the blue subpixel Pb is of a non-tandem type. Hence, the life of the blue subpixel Pb is improved, which in turn improves the life of the display device 2**.

In the present disclosure, the "current consumption efficiency" is the proportion of the light-emission luminance of the display device to the electric power consumption of the display device. The current consumption efficiency is higher when the display device can emit light with higher luminance at lower current consumption.

Method of Manufacturing Light-Emitting Element Layer

Figure 7:
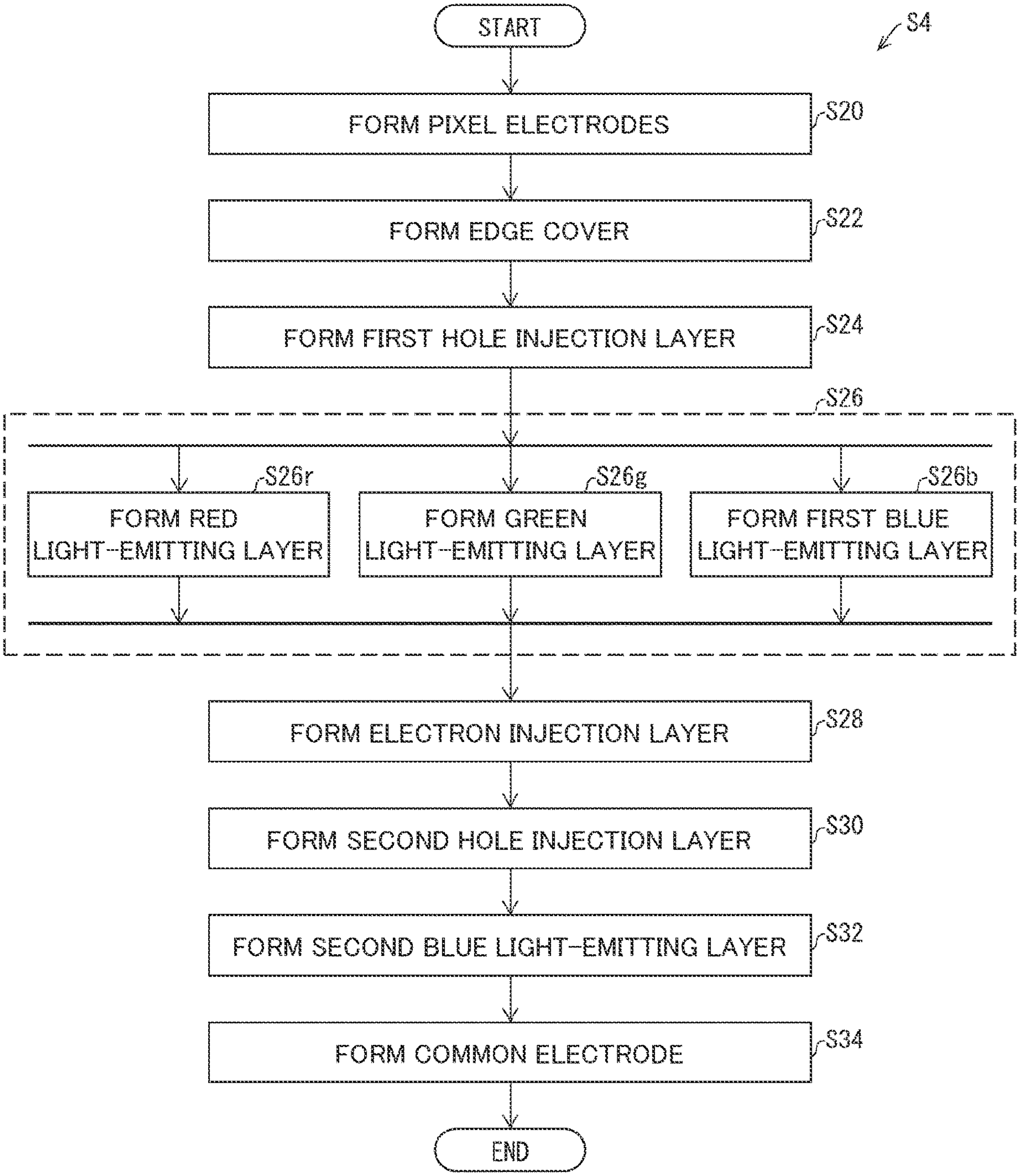
FIG. 7 is a schematic flow chart representing a non-limiting example of a method of manufacturing the light-emitting element layer shown in FIG. 4.

FIG. 7 is a schematic flow chart representing a non-limiting example of a method of manufacturing the light-emitting element layer 5 shown in FIG. 4.

Referring to FIG. 7, in the formation of the light-emitting element layer 5 (step S4), first, the pixel electrode 22 is formed as an anode in each of the red subpixel Pr, the green subpixel Pg, and the blue subpixel Pb (step S20; first electrode formation step). Step S20 may be performed by, for example, forming a conductive material layer on the entire thin film transistor layer 4, forming a resist layer on the entire conductive material layer, patterning the resist layer by photolithography, and etching the conductive material layer using the resist layer as a mask. The resist layer is removed after etching. In addition, wires may be formed simultaneously with the pixel electrodes 22.

Next, the edge cover 23 is formed so as to cover the edges of the pixel electrodes 22 (step S22). Step S22 may be performed by, for example, forming a resist layer containing polyimide (PI), patterning the resist layer by photolithography, and baking the resist layer.

Next, the first hole injection layer 50 is formed (step S24). In step S24, for example, when the first hole injection layer 50 is to be formed, the first hole injection layer 50 is formed by vacuum vapor deposition using a common metal mask (CMM). The common metal mask has an opening that corresponds to the entire display area DA. In step S24, for example, when the first hole injection layer 50 is to be formed in each of the red subpixel Pr, the green subpixel Pg, and the blue subpixel Pb, the first hole injection layer 50 may be formed by vacuum vapor deposition using a fine metal mask (FMM). The FMM in step S24 has openings that correspond to the red subpixels Pr, the green subpixels Pg, and the blue subpixels Pb.

Next, the first photoelectric conversion layer 40 is formed so as to cover the pixel electrode 22 (step S26; first photoelectric conversion layer formation step). In step S26, the red light-emitting layer **40*r* is formed in the red subpixel Pr (step S26*r*), the green light-emitting layer 40*g* is formed in the green subpixel Pg (step S26*g*), and the first blue light-emitting layer 40_b_ is formed in the blue subpixel Pb (step S26_b_). In step S26**, the light-emitting layers may be formed in any order and by any method.

For instance, in step S26_r_, the red light-emitting layer 40_r_ may be formed by vacuum vapor deposition using a fine metal mask (FMM). The FMM in step S26_r_ has openings that correspond to the red subpixels Pr. The description applies equally to steps S26_g_ and S26_b_.

Subsequently, the electron injection layer 42 is provided across the entire display area DA (step S28; first electric charge injection layer formation step). In step S28, the electron injection layer 42 is formed by, for example, vacuum vapor deposition using a common metal mask (CMM).

Subsequently, the second hole injection layer 44 is formed only in the blue subpixel Pb (step S30; second electric charge injection layer formation step). In step S30, the second hole injection layer 44 is formed by, for example, vacuum vapor deposition using a fine metal mask (FMM). The FMM in step S30 has openings that correspond to the blue subpixels Pb.

Subsequently, the second photoelectric conversion layer 46 is formed at least in the blue subpixel Pb (step S32; second photoelectric conversion layer formation step). Here, the second photoelectric conversion layer 46 contains the second blue light-emitting layer 46_b_. In step S32, for example, when the second blue light-emitting layer 46_b_ is formed only in the blue subpixels Pb, the same process may be performed as in step S26_b_. In step S32, for example, when the second blue light-emitting layer 46_b_ is provided across the entire display area DA, the second blue light-emitting layer 46_b_ is formed by vacuum vapor deposition using a common metal mask (CMM).

Next, the common electrode 25 is provided as a cathode across the entire display area DA (step S34; second electrode formation step). In step S34, the common electrode 25 is formed by, for example, vacuum vapor deposition using a common metal mask (CMM). The common metal mask has an opening that corresponds to the entire display area DA.

Patterning

According to the foregoing description, high definition patterning using an FMM is performed in the step of forming the second hole injection layer 44 (step S30) and in the optional step of forming the second blue light-emitting layer 46_b_ (step S32), as well as in the steps of forming the red light-emitting layer 40_r_, the green light-emitting layer 40_g_, and the first blue light-emitting layer 40_b_ contained in the first photoelectric conversion layer 40 (steps S26_r_, S24_g_, and S24_b_).

For instance, in the configuration disclosed in Patent Literature 1, all layers in the charge generation layer need to be patterned with high definition, and the charge generation layer includes at least two layers. In addition, for example, in the configuration disclosed in Patent Literature 2, the two blue light-emitting layers both need to be patterned with high definition.

Therefore, the configuration in accordance with the present embodiment needs high definition patterning as few times as, or even fewer times than, known art. Therefore, according to the configuration in accordance with the present embodiment, the display device 2 has high productivity.

According to the foregoing description, a CMM is used in the step of forming the electron injection layer 42 (step S28). Vapor deposition using a CMM, when compared with vapor deposition using an FMM, tends to be resistant to strain caused by hot stretching and tends to require a low level of precision in forming layers of different materials. In addition, in relation to the charge transport layer and the electric charge injection layer, a structure containing a metal material tends to have a superior electric charge mobility to a structure containing no metal material. Therefore, the electron injection layer 42 preferably contains a metal material to improve electric charge generation efficiency.

According to the configuration disclosed in Patent Literature 1, each layer in the charge generation layer is made of a different material. Therefore, it is difficult to use a metal material for the layers contained in the charge generation layer. Metal materials have a higher vapor deposition temperature than organic materials. Therefore, when a metal material is vapor-deposited using a vapor deposition source disposed close to the FMM, the FMM will hot stretch, causing a decrease in precision in the formation of layers of different materials. In addition, when a metal material is vapor-deposited using a vapor deposition source disposed far from the FMM, the use efficiency of the metal material drops significantly.

According to the foregoing description, an FMM is used in the step of forming the second hole injection layer 44 (step S30). Therefore, the second hole injection layer 44 preferably contains only organic materials for the reasons described in relation to Patent Literature 1, to maintain or improve the precision of the formation of layers of different materials and the use efficiency of vapor deposition materials in step S30.

Variation Examples

The description has so far discussed examples in which the second photoelectric conversion layer 46 contains the second blue light-emitting layer 46_b_. The scope of the present disclosure is however not limited to these examples. For example, the second photoelectric conversion layer 46 may contain a second red light-emitting layer instead of the second blue light-emitting layer 46_b_. The second red light-emitting layer is provided at least in the red subpixels Pr. In such cases, the light-emitting elements ES in the red subpixels Pr are of a tandem type, and the light-emitting elements ES in the green subpixels Pg and the blue subpixels Pb are of a non-tandem type. In addition, for example, the second photoelectric conversion layer 46 may contain a second green light-emitting layer instead of the second blue light-emitting layer 46_b_. The second green light-emitting layer is provided at least in the green subpixels Pg. In such cases, the light-emitting elements ES in the red subpixels Pr are of a tandem type, and the light-emitting elements ES in the green subpixels Pg and the blue subpixels Pb are of a non-tandem type.

In which subpixels the light-emitting elements ES are of a tandem type is preferably determined on the basis of luminous efficiency. Specifically, the subpixels in which the light-emitting layer that has the lowest luminous efficiency among the light-emitting layers contained in the first photoelectric conversion layer 40 (i.e., the red light-emitting layer 40_r_, the green light-emitting layer 40_g_, and the first blue light-emitting layer 40_b_) is provided are preferably selected. Therefore, the configuration shown in FIG. 4 is preferred when the luminous efficiency of the first blue light-emitting layer 40_b_ is lower than the luminous efficiency of the red light-emitting layer 40_r_ and the green light-emitting layer 40_g_.

Embodiment 2

The following will describe another embodiment of the disclosure. Note that for convenience of description, members of the present embodiment that have the same function as members of the preceding embodiment are indicated by the same or similar reference numerals, and description thereof is not repeated.

Figure 8:
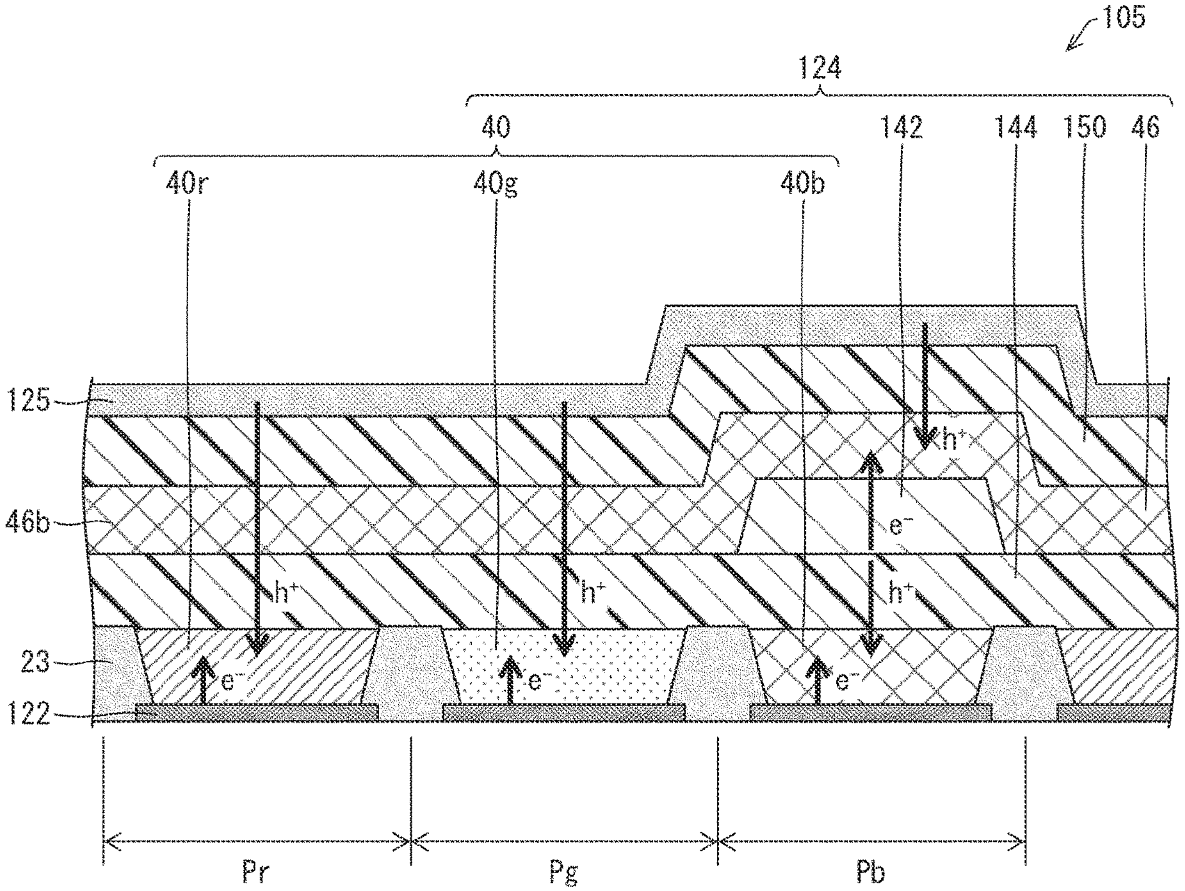
FIG. 8 is a schematic cross-sectional view of a non-limiting example of a structure of a light-emitting element layer in a display area in accordance with an embodiment of the present disclosure.

FIG. 8 is a schematic cross-sectional view of a non-limiting example of a structure of a light-emitting element layer 105 in the display area DA in accordance with the present embodiment. In the present embodiment, a pixel electrode 122 is a cathode, and a common electrode 125 is an anode.

Referring to FIG. 8, the light-emitting element layer 105 includes: pixel electrodes 122 (first electrodes), the first photoelectric conversion layer 40, a first hole injection layer 144 (first electric charge injection layer) having an opposite polarity from the pixel electrodes 122, an electron injection layer 142 (second electric charge injection layer) having the same polarity as the pixel electrodes 122, the second photoelectric conversion layer 46, a second hole injection layer 150 having an opposite polarity from the pixel electrodes 122, and the common electrode 125 having an opposite polarity from the pixel electrodes 122 (second electrodes), which are provided in this order. The light-emitting element layer 105 may further include additional layers (not shown).

In the present disclosure, "having an opposite polarity from the pixel electrode 122" indicates that the component injects or transports electric charge that has an opposite polarity from the electric charge that is injected to the first photoelectric conversion layer 40 by the pixel electrode 122. On the other hand, "having the same polarity as the pixel electrode 122" indicates that the component injects or transports electric charge that has the same polarity as the electric charge that is injected to the first photoelectric conversion layer 40 by the pixel electrode 122. Since the pixel electrode 122 is a cathode in the present embodiment, those components "having an opposite polarity from the pixel electrode 122" are anodes, hole transport layers, and hole injection layers. On the other hand, those components "having the same polarity as the pixel electrode 122" are cathodes, electron transport layers, and electron injection layers.

At least either the pixel electrodes 122 and the common electrode 125 are a transparent electrode(s).

The first hole injection layer 144 contains a hole injection material to inject holes to the first photoelectric conversion layer 40. The second hole injection layer 150 contains a hole injection material to inject holes to the second photoelectric conversion layer 46. The first hole injection layer 144 and the second hole injection layer 150 disrupt transport of electrons. The first hole injection layer 144 and the second hole injection layer 150 are provided across the entire display area DA.

The electron injection layer 142 contains an electron injection material to inject electrons the second photoelectric conversion layer 46. The electron injection layer 142 disrupts transport of holes. The electron injection layer 42 is provided only in the blue subpixels Pb.

The material for the electroluminescent layer 24 is selected so that (i) a charge generation layer can be formed in the blue subpixels Pb, but that (ii) no charge generation layer is formed in the red subpixels Pr and the green subpixels Pg.

First of all, in the blue subpixel Pb, materials are selected for the electron injection layer 142, the first hole injection layer 144, and the first blue light-emitting layer **40*b* in such a manner that electrons can be easily withdrawn from the conduction band of the first hole injection layer 144 to the conduction band of the electron injection layer 142 and/or that electrons can be easily withdrawn from the valence band of the first blue light-emitting layer 40*b* to the conduction band of the first hole injection layer 144**.

Electrons are withdrawn from the conduction band of the first hole injection layer 144 to the conduction band of the electron injection layer 142 in the same manner as electrons are withdrawn from the conduction band of the second hole injection layer 44 to the conduction band of the electron injection layer 42 (arrow A in FIG. 5) in Embodiment 1 described above, and no detailed description is given here. Electrons are withdrawn from the valence band of the first blue light-emitting layer **40*b* to the conduction band of the first hole injection layer 144 in the same manner as electrons are withdrawn from the valence band of the second blue light-emitting layer 46*b* to the conduction band of the second hole injection layer 44 (arrow B in FIG. 5**) in Embodiment 1 described above, and no detailed description is given here.

Then, the electron injection layer 142 receives electrons from the first hole injection layer 144 to supply the electrons to the conduction band of the second blue light-emitting layer **46*b*. Therefore, the energy difference between the Fermi level of the electron injection layer 142 and the LUMO of the second blue light-emitting layer 46*b* is preferably sufficiently small as to facilitate the injection of electrons from the electron injection layer 142 to the second blue light-emitting layer 46*b***.

As described in the foregoing, holes are injected from the first hole injection layer 144 to the first blue light-emitting layer **40*b*. Then, electrons are injected from the electron injection layer 142 to the second blue light-emitting layer 46*b*. Therefore, in the blue subpixel Pb, the combination of the electron injection layer 142 and the first hole injection layer 144 functions as a charge generation layer, enabling the second blue light-emitting layer 46*b*** to emit light.

Secondly, in the red subpixel Pr and the green subpixel Pg, materials are selected for the first hole injection layer 144 and the second blue light-emitting layer **46*b* in such a manner that electrons cannot be easily withdrawn from the conduction band of the first hole injection layer 144 to the conduction band of the second blue light-emitting layer 46*b*. Specifically, these materials are selected so that (i) the LUMO of the second blue light-emitting layer 46*b* is positioned between the vacuum energy level and the LUMO of the first hole injection layer 144 and also that (ii) the energy difference between the LUMO of the second blue light-emitting layer 46*b* and the LUMO of the first hole injection layer 144 is sufficiently large. When this is the case, the energy barrier is so high that it is difficult to withdraw thermally excited electrons from the conduction band of the first hole injection layer 144 to the conduction band of the second blue light-emitting layer 46*b***.

Therefore, the first hole injection layer 144 does not inject electrons to the second blue light-emitting layer **46*b*, and the holes injected from the common electrode 125 to the second blue light-emitting layer 46*b* are injected to the red light-emitting layer 40*r* or the green light-emitting layer 40*g* via the second blue light-emitting layer 46*b* and the electron injection layer 42. Therefore, no charge generation layer is formed in the red subpixel Pr and the green subpixel Pg, which prohibits the second blue light-emitting layer 46*b* from emitting light. Since there is no charge generation layer, the second photoelectric conversion layer 46 does not emit light in the red subpixel Pr and the green subpixel Pg even when those portions of the second photoelectric conversion layer 46 that correspond to the red subpixel Pr and the green subpixel Pg include a light-emitting layer other than the second blue light-emitting layer 46*b***.

Therefore, according to the configuration in accordance with the present embodiment, the same effects are achieved as the configuration in accordance with Embodiment 1 described above. In addition, the configuration in accordance with the present embodiment may be modified in the same manner as is the case with the configuration in accordance with Embodiment 1 described above.

Method of Manufacturing Light-Emitting Element Layer

Figure 9:
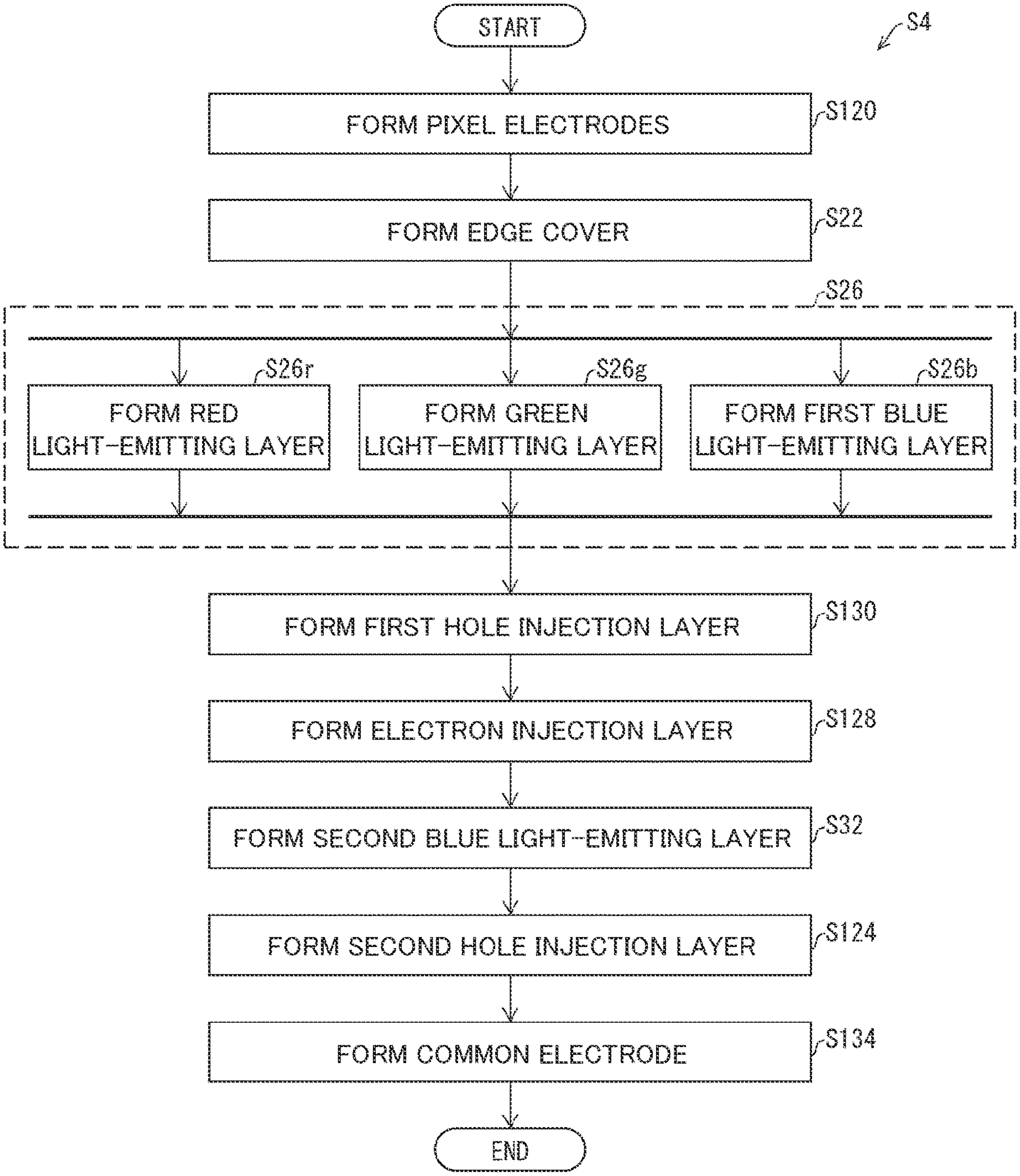
FIG. 9 is a schematic flow chart representing a non-limiting example of a method of manufacturing the light-emitting element layer shown in FIG. 8.

FIG. 9 is a schematic flow chart representing a non-limiting example of a method of manufacturing the light-emitting element layer 105 shown in FIG. 8.

Referring to FIG. 9, in the formation of the light-emitting element layer 105 (step S4), first, the pixel electrode 122 is formed as a cathode in each of the red subpixel Pr, the green subpixel Pg, and the blue subpixel Pb (step S120; first electrode formation step). Next, step S22 and step S26 are sequentially performed.

Subsequently, the first hole injection layer 144 is provided across the entire display area DA (step S130; first electric charge injection layer formation step). In step S130, the first hole injection layer 144 is formed by, for example, vacuum vapor deposition using a common metal mask (CMM).

Subsequently, the electron injection layer 142 is formed only in the blue subpixel Pb (step S128; second electric charge injection layer formation step). In step S128, the electron injection layer 142 is formed by, for example, vacuum vapor deposition using a fine metal mask (FMM).

Subsequently, step S32 is performed, and next, the first hole injection layer 144 is provided across the entire display area DA (step S124). In step S124, the first hole injection layer 144 is formed by, for example, vacuum vapor deposition using a common metal mask (CMM).

Next, the common electrode 125 is provided as an anode across the entire display area DA (step S134; second electrode formation step). In step S134, the common electrode 125 is formed by, for example, vacuum vapor deposition using a common metal mask (CMM).

Patterning

According to the foregoing description, high definition patterning using an FMM is performed in the step of forming the electron injection layer 142 (step S128) and in the optional step of forming the second blue light-emitting layer 46*b* (step S32), as well as in the steps of forming the red light-emitting layer 40*r*, the green light-emitting layer 40*g*, and the first blue light-emitting layer 40*b* contained in the first photoelectric conversion layer 40 (steps S26*r*, S24*g*, and S24*b*).

Therefore, according to the method in accordance with the present embodiment, the display device 2 has high productivity in the same manner as is the case with the method in accordance with Embodiment 1 described above.

According to the foregoing description, a CMM is used in the step of forming the first hole injection layer 144 (step S130). Therefore, the first hole injection layer 144 preferably contains a metal material to improve electric charge generation efficiency.

In addition, an FMM is used in the step of forming the electron injection layer 142 (step S128). Therefore, the electron injection layer 142 preferably contains only organic materials.

Embodiment 3

The following will describe another embodiment of the disclosure. Note that for convenience of description, members of the present embodiment that have the same function as members of the preceding embodiment are indicated by the same or similar reference numerals, and description thereof is not repeated.

Figure 10:
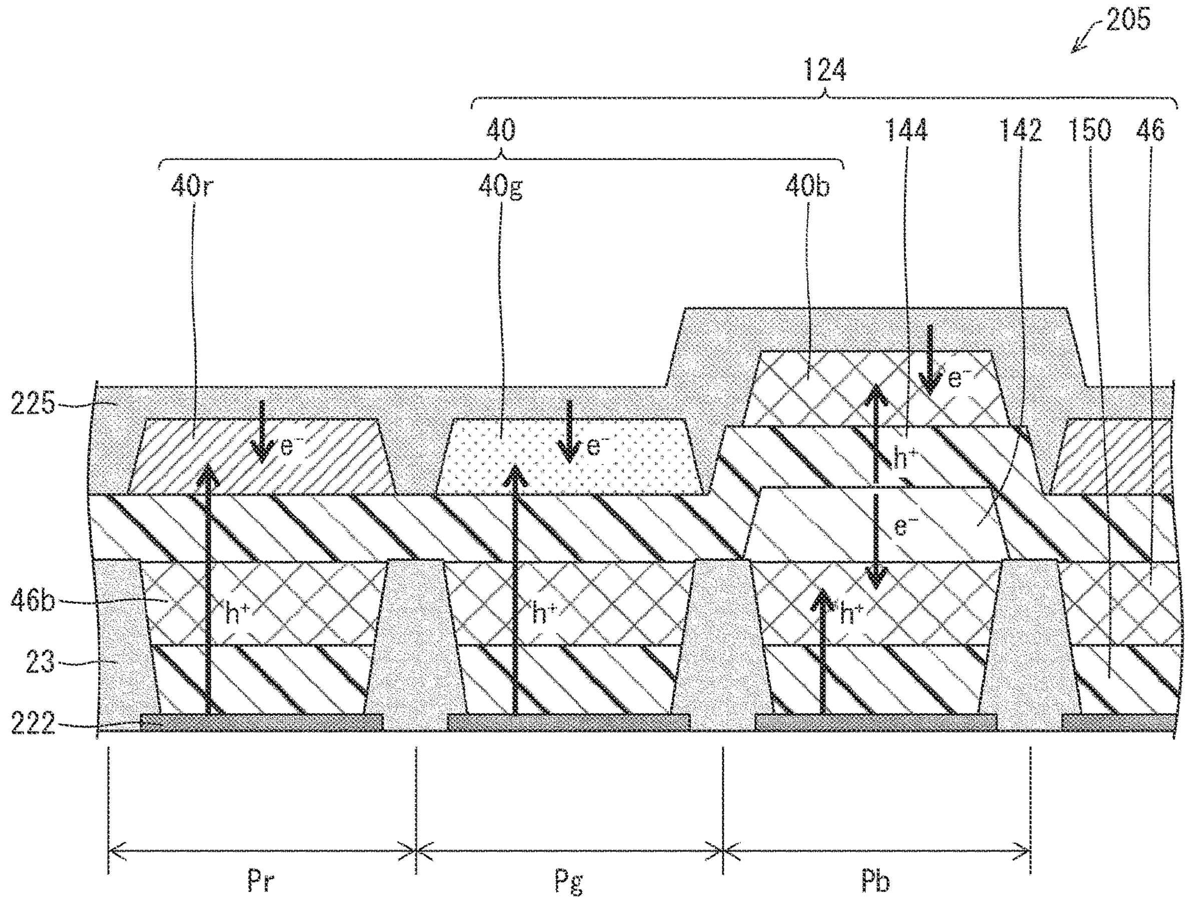
FIG. 10 is a schematic cross-sectional view of a non-limiting example of a structure of a light-emitting element layer in a display area in accordance with an embodiment of the present disclosure.

FIG. 10 is a schematic cross-sectional view of a non-limiting example of a structure of a light-emitting element layer 205 in the display area DA in accordance with the present embodiment. In the present embodiment, a pixel electrode 222 is an anode, and a common electrode 225 is a cathode.

Referring to FIG. 10, the light-emitting element layer 205 includes: the common electrode 225 (first electrode); the first photoelectric conversion layer 40; the first hole injection layer 144 (first electric charge injection layer) having an opposite polarity from the common electrode 225; the electron injection layer 142 (second electric charge injection layer) having the same polarity as the common electrode 225; the second photoelectric conversion layer 46; the second hole injection layer 150 having an opposite polarity from the common electrode 225; and pixel electrodes 222 (second electrodes) having an opposite polarity from the common electrode 225, which are provided in this order. The light-emitting element layer 205 may further include additional layers (not shown).

The common electrode 225 and the pixel electrodes 222 in accordance with the present embodiment may have the same structure as the common electrode 25 and the pixel electrodes 22 in Embodiment 1 described above respectively.

In the present disclosure, "having an opposite polarity from the common electrode 225" indicates that the component injects or transports electric charge that has an opposite polarity from the electric charge that is injected to the first photoelectric conversion layer 40 by the common electrode 225. On the other hand, "having the same polarity as the common electrode 225" indicates that the component injects or transports electric charge that has the same polarity as the electric charge that is injected to the first photoelectric conversion layer 40 by the common electrode 225. Since the common electrode 225 is a cathode In the present embodiment, those components "having an opposite polarity from the common electrode 225" are anodes, hole transport layers, and hole injection layers. On the other hand, those components "having the same polarity as the common electrode 225" are cathodes, electron transport layers, and electron injection layers.

Therefore, according to the configuration in accordance with the present embodiment, the same effects are achieved as the configuration in accordance with Embodiment 1 described above. In addition, the configuration in accordance with the present embodiment may be modified in the same manner as is the case with the configuration in accordance with Embodiment 1 described above.

Method of Manufacturing Light-Emitting Element Layer

Figure 11:
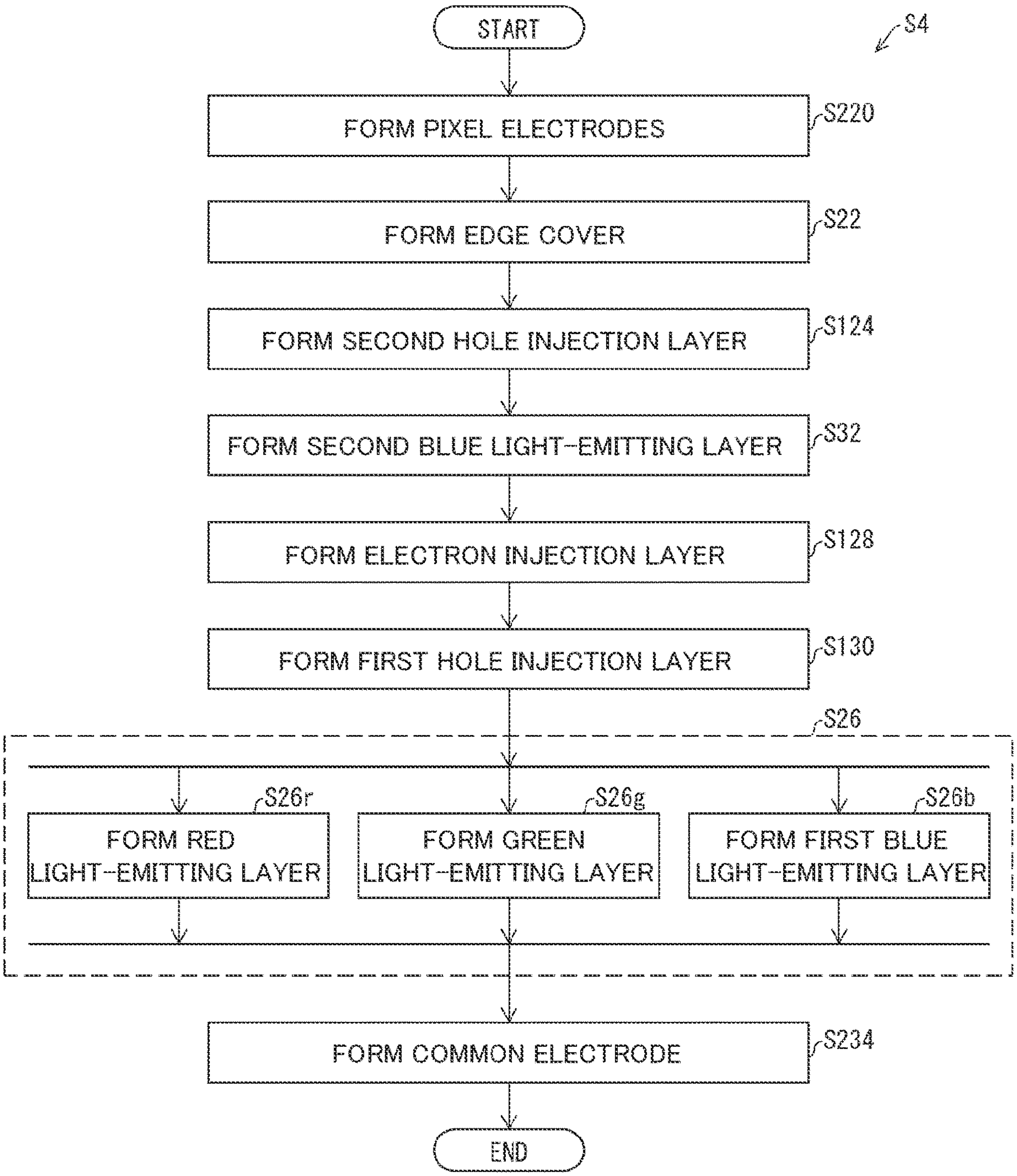
FIG. 11 is a schematic flow chart representing a non-limiting example of a method of manufacturing the light-emitting element layer shown in FIG. 10.

FIG. 11 is a schematic flow chart representing a non-limiting example of a method of manufacturing the light-emitting element layer 205 shown in FIG. 10.

Referring to FIG. 11, in the formation of the light-emitting element layer 205 (step S4), first, the pixel electrode 222 is formed as an anode in each of the red subpixel Pr, the green subpixel Pg, and the blue subpixel Pb (step S220; second electrode formation step). Next, step S22 and step S124 are sequentially performed. Next, the second photoelectric conversion layer 46 is formed so as to cover at least the pixel electrode 222 in the blue subpixel Pb (step S32; second photoelectric conversion layer formation step). Here, the second photoelectric conversion layer 46 contains the second blue light-emitting layer 46*b*.

Next, step S128, step S130, and step S26 are sequentially performed. Next, the common electrode 225 is formed as a cathode across the entire display area DA (step S234; first electrode formation step). In step S234, the common electrode 225 is formed by, for example, vacuum vapor deposition using a common metal mask (CMM). The common metal mask has an opening that corresponds to the entire display area DA.

Therefore, according to the method in accordance with the present embodiment, the display device 2 has high productivity in the same manner as is the case with the method in accordance with Embodiment 1 described above.

Embodiment 4

The following will describe another embodiment of the disclosure. Note that for convenience of description, members of the present embodiment that have the same function as members of the preceding embodiment are indicated by the same or similar reference numerals, and description thereof is not repeated.

Figure 12:
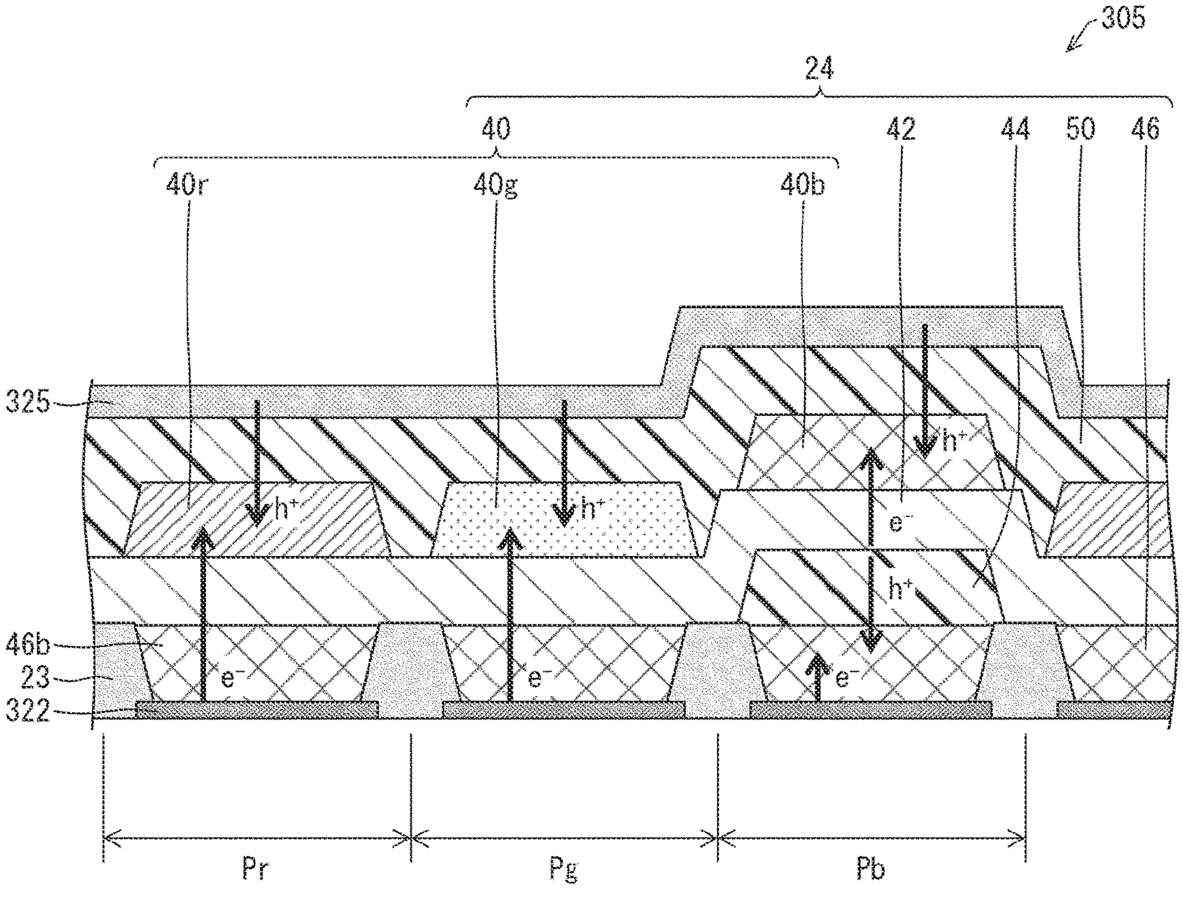
FIG. 12 is a schematic cross-sectional view of a non-limiting example of a structure of a light-emitting element layer in a display area in accordance with an embodiment of the present disclosure.

FIG. 12 is a schematic cross-sectional view of a non-limiting example of a structure of a light-emitting element layer 305 in the display area DA in accordance with the present embodiment. In the present embodiment, a pixel electrode 322 is a cathode, and a common electrode 325 is an anode.

Referring to FIG. 12, the light-emitting element layer 305 includes: the common electrode 325 (first electrode); the first hole injection layer 50 having the same polarity as the common electrode 325; the first photoelectric conversion layer 40; the electron injection layer 42 (first electric charge injection layer) having an opposite polarity from the common electrode 325; the second hole injection layer 44 (second electric charge injection layer) having the same polarity as the common electrode 325; the second photoelectric conversion layer 46; and the pixel electrodes 322 (second electrodes) having an opposite polarity from the common electrode 325, which are provided in this order. The light-emitting element layer 305 may further include additional layers not shown).

In the present disclosure, "having an opposite polarity from the common electrode 325" indicates that the component injects or transports electric charge that has an opposite polarity from the electric charge injected to the first photoelectric conversion layer 40 by the common electrode 325. On the other hand, "having the same polarity as the common electrode 325" indicates that the component injects or transports electric charge that has the same polarity as the electric charge that is injected to the first photoelectric conversion layer 40 by the common electrode 325. Since the common electrode 325 is an anode in the present embodiment, those components "having an opposite polarity from the common electrode 325" are cathodes, electron transport layers, and electron injection layers. On the other hand, those components "having the same polarity as the common electrode 325" are anodes, hole transport layers, and hole injection layers.

Therefore, according to the configuration in accordance with the present embodiment, the same effects are achieved as the configuration in accordance with Embodiment 1 described above. In addition, the configuration in accordance with the present embodiment may be modified in the same manner as is the case with the configuration in accordance with Embodiment 1 described above.

Method of Manufacturing Light-Emitting Element Layer

Figure 13:
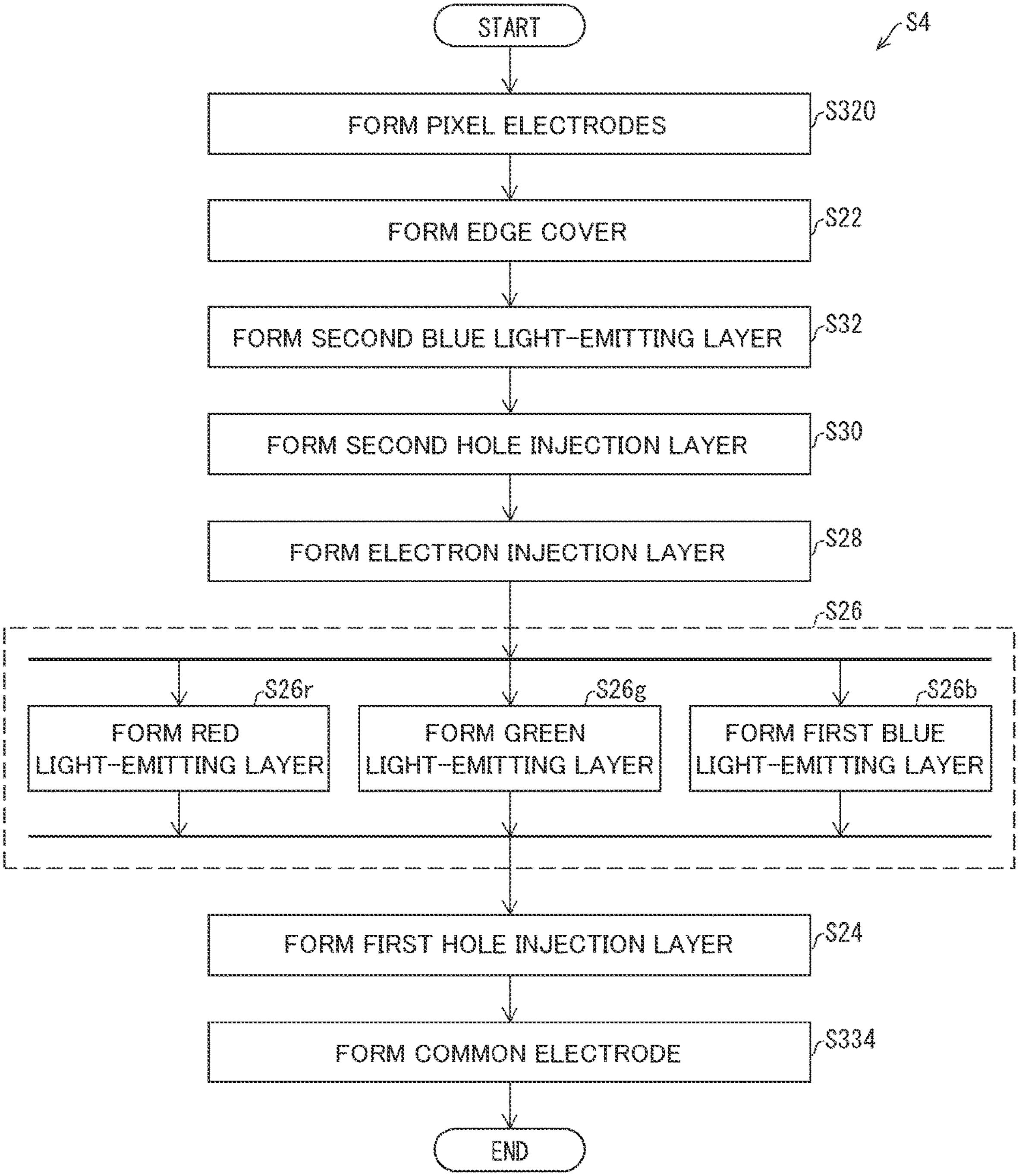
FIG. 13 is a schematic flow chart representing a non-limiting example of a method of manufacturing the light-emitting element layer shown in FIG. 10.

FIG. 13 is a schematic flow chart representing a non-limiting example of a method of manufacturing the light-emitting element layer 305 shown in FIG. 12.

Referring to FIG. 13, in the formation of the light-emitting element layer 305 (step S4), first, the pixel electrode 322 is formed as a cathode in each of the red subpixel Pr, the green subpixel Pg, and the blue subpixel Pb (step S320; second electrode formation step). Next, step S22, step S32, step S30, step S28, step S26, and step S24 are performed sequentially.

Next, the common electrode 325 is formed as an anode across the entire display area DA (step S334; first electrode formation step). In step S334, the common electrode 325 is formed by, for example, vacuum vapor deposition using a common metal mask (CMM). The common metal mask has an opening that corresponds to the entire display area DA.

Therefore, according to the method in accordance with the present embodiment, the display device 2 has high productivity in the same manner as in the case with the method in accordance with Embodiment 1 described above.

Embodiment 5

The following will describe another embodiment of the disclosure. Note that for convenience of description, members of the present embodiment that have the same function as members of the preceding embodiment are indicated by the same or similar reference numerals, and description thereof is not repeated.

Figure 14:
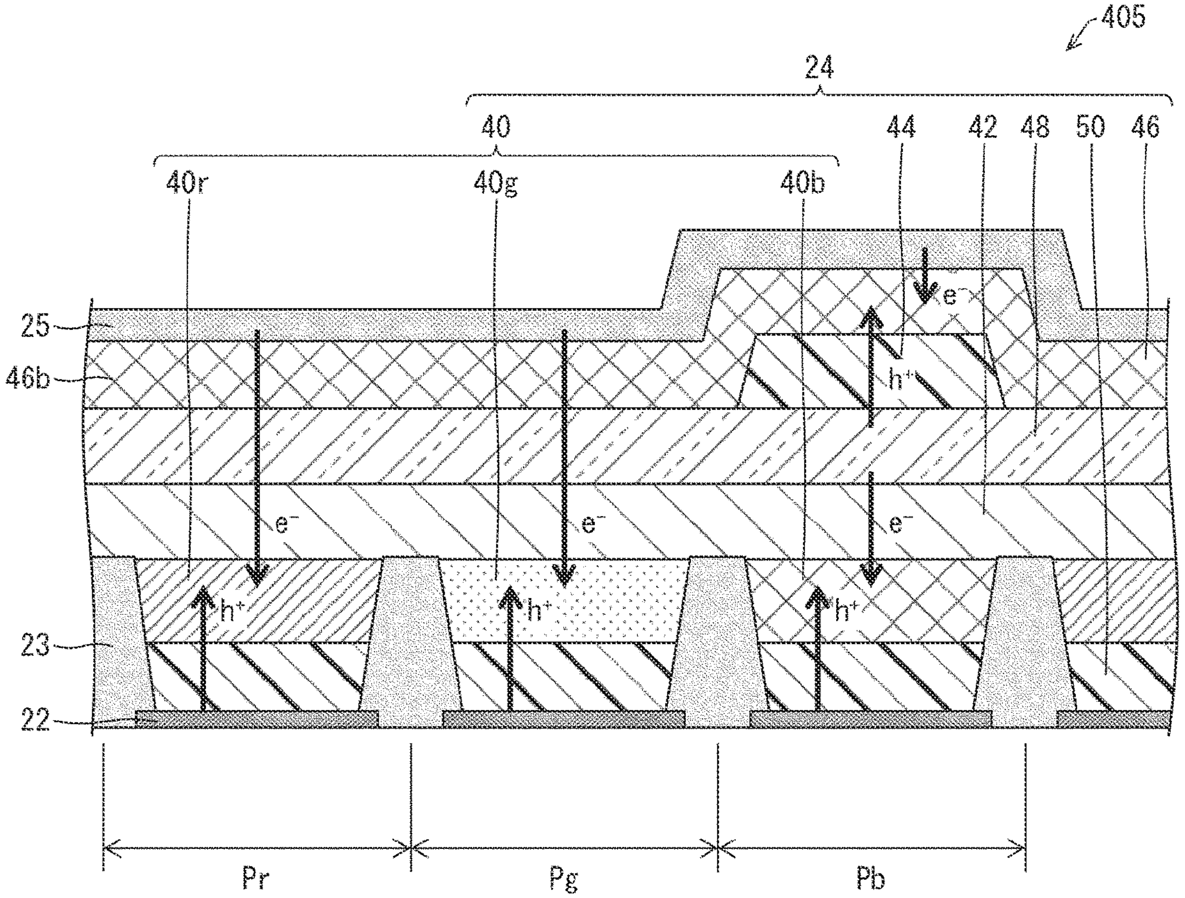
FIG. 14 is a schematic cross-sectional view of a non-limiting example of a structure of a light-emitting element layer in a display area in accordance with an embodiment of the present disclosure.

FIG. 14 is a schematic cross-sectional view of a non-limiting example of a structure of a light-emitting element layer 405 in the display area DA in accordance with the present embodiment. In the present embodiment, the pixel electrode 22 is an anode, and the common electrode 25 is a cathode.

Referring to FIG. 14, the light-emitting element layer 405 in accordance with the present embodiment has the same structure as the light-emitting element layer 5 (see FIG. 4) in accordance with Embodiment 1 described above, except that the former additionally includes an electrically conductive transparent film 48.

The electrically conductive transparent film 48 is positioned between the electron injection layer 42 and the second hole injection layer 44 and provided at least in the red subpixel Pr and in the green subpixel Pg. The electrically conductive transparent film 48 is preferably provided across the entire display area DA with a view to reducing patterning for improved productivity.

The electrically conductive transparent film 48 is made of a transparent metal such as ITO, IZO, or indium gallium zin oxide. The electrically conductive transparent film 48 includes, for example, an approximately 5-nm film of a transparent metal. Alternatively, the electrically conductive transparent film 48 may include a film of aluminum or a like non-transparent metal that is sufficiently thin as to allow transmission of light. The electrically conductive transparent film 48 may include, for example, an approximately 1-nm to 2-nm film of aluminum.

The material for the electroluminescent layer 24 is selected so that (i) a charge generation layer can be formed in the blue subpixels Pb, but that (ii) no charge generation layer is formed in the red subpixels Pr and the green subpixels Pg.

First of all, in the blue subpixel Pb, materials are selected for the second hole injection layer 44, the electron injection layer 42, and the second blue light-emitting layer **46*b* in such a manner that electrons can be easily withdrawn from the conduction band of the second hole injection layer 44 to the conduction band of the electrically conductive transparent film 48 and/or that electrons can be easily withdrawn from the valence band of the second blue light-emitting layer 46***b* to the conduction band of the second hole injection layer 44. Furthermore, materials are selected for the electrically conductive transparent film 48 and the electron injection layer 42 in such a manner that electrons can also be easily supplied from the conduction band of the electrically conductive transparent film 48 to the conduction band of the electron injection layer 42.

Electrons are withdrawn from the conduction band of the second hole injection layer 44 to the conduction band of the electrically conductive transparent film 48 as electrons are withdrawn from the conduction band of the second hole injection layer 44 to the conduction band of the electron injection layer 42 (arrow A in FIG. 5) in Embodiment 1, and no detailed description is given here. The withdrawal of electrons from the valence band of the second blue light-emitting layer 46*b* to the conduction band of the second hole injection layer 44 is described in Embodiment 1 with reference to arrow B in FIG. 5, and the same description is not repeated here.

Then, the electrically conductive transparent film 48 receives electrons from the second hole injection layer 44 to supply the electrons to the conduction band of the electron injection layer 42. Then, the electron injection layer 42 receives electrons from the electrically conductive transparent film 48 to inject the electrons to the conduction band of the first blue light-emitting layer 40*b*. Therefore, the energy difference between the Fermi level of the electrically conductive transparent film 48 and the Fermi level of the electron injection layer 42 is preferably sufficiently small, and also the energy difference between the Fermi level of the electron injection layer 42 and the LUMO of the first blue light-emitting layer 40*b* is preferably sufficiently small, as to facilitate the injection of electrons from the electrically conductive transparent film 48 to the electron injection layer 42 and the injection of electrons from the electron injection layer 42 to the first blue light-emitting layer 40*b*.

As described in the foregoing, holes are injected from the second hole injection layer 44 to the second blue light-emitting layer 46*b*. Then, electrons are injected from the electron injection layer 42 to the first blue light-emitting layer 40*b*. Therefore, in the blue subpixel Pb, the combination of the electron injection layer 42, the electrically conductive transparent film 48, and the second hole injection layer 44 functions as a charge generation layer, enabling the second blue light-emitting layer 46*b* to emit light.

Secondly, in the red subpixel Pr and the green subpixel Pg, materials are selected for the electrically conductive transparent film 48 and the second blue light-emitting layer 46*b* so that electrons cannot be easily withdrawn from the valence band of the second blue light-emitting layer 46*b* to the conduction band of the electrically conductive transparent film 48. Specifically, these materials are selected so that (i) the Fermi level of the electrically conductive transparent film 48 is positioned between the vacuum energy level and the HOMO of the second blue light-emitting layer 46*b* and also that (ii) the energy difference between the Fermi level of the electrically conductive transparent film 48 and the HOMO the second blue light-emitting layer 46*b* is sufficiently large. When this is the case, the energy barrier is so high that electrons are not so easily withdrawn as to produce holes in the valence band of the second blue light-emitting layer 46*b*.

Therefore, the electrically conductive transparent film 48 does not inject holes to the second blue light-emitting layer 46*b*, and the electrons injected from the common electrode 25 to the second blue light-emitting layer 46*b* are injected to the red light-emitting layer 40*r* or the green light-emitting layer 40*g* via the second blue light-emitting layer 46*b*, and the electrically conductive transparent film 48, and the electron injection layer 42. Therefore, no charge generation layer is formed in the red subpixel Pr and the green subpixel Pg, which prohibits the second blue light-emitting layer 46*b* from emitting light.

Therefore, according to the configuration in accordance with the present embodiment, the same effects are achieved as the configuration in accordance with Embodiment 1 described above. In addition, the configuration in accordance with the present embodiment may be modified in the same manner as is the case with the configuration in accordance with Embodiment 1 described above.

Method of Manufacturing Light-Emitting Element Layer

Figure 15:
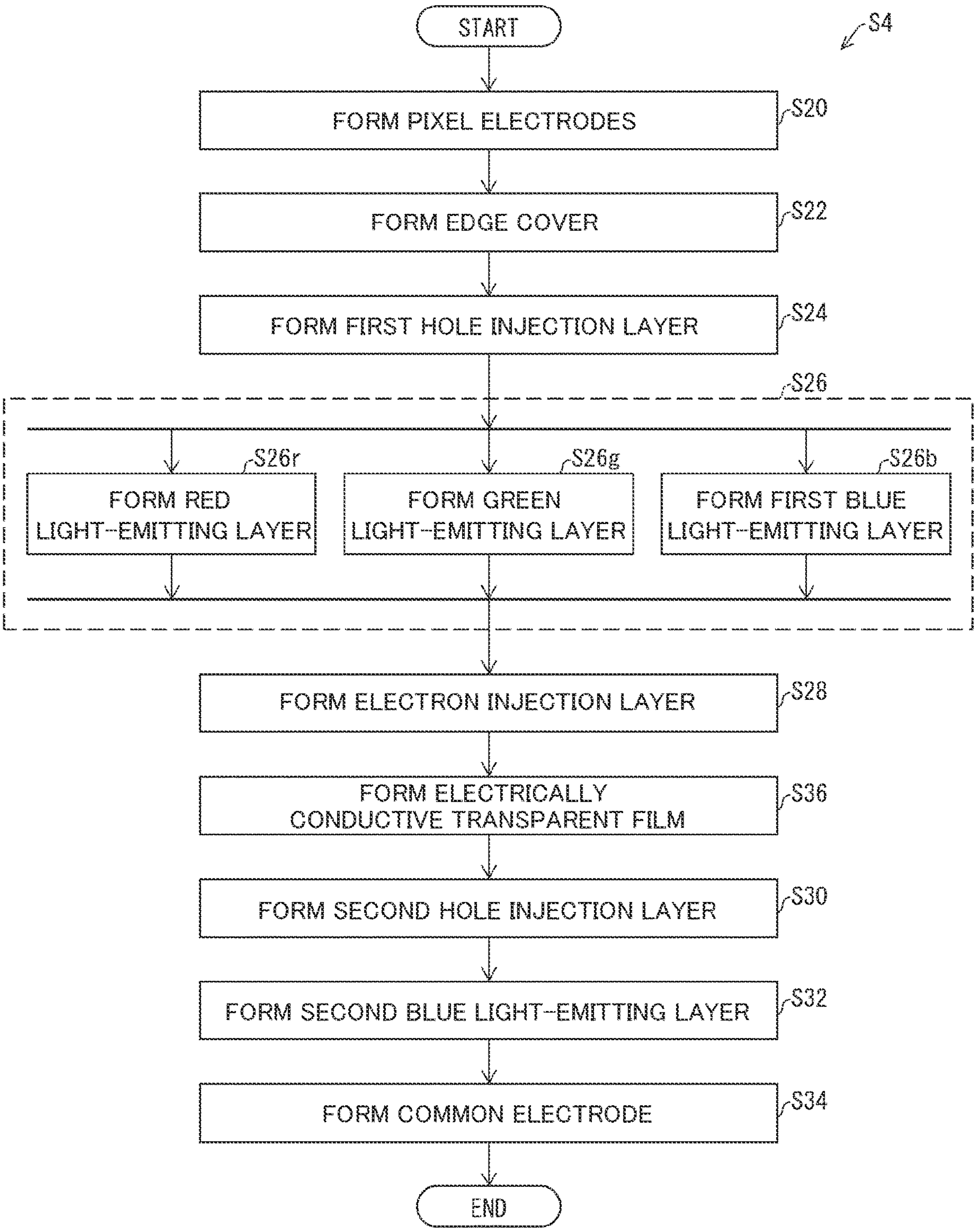
FIG. 15 is a schematic flow chart representing a non-limiting example of a method of manufacturing the light-emitting element layer shown in FIG. 14.

FIG. 15 is a schematic flow chart representing a non-limiting example of a method of manufacturing the light-emitting element layer 405 shown in FIG. 14.

Referring to FIG. 15, the method of manufacturing the light-emitting element layer 405 in accordance with the present embodiment can be provided by additionally including a step of forming the electrically conductive transparent film 48 (step S36) between step S28 and step S30 of the method of manufacturing the light-emitting element layer 5 in accordance with Embodiment 1 described above. In step S36, the electrically conductive transparent film 48 is formed by, for example, sputtering or ion plating. Therefore, the electrically conductive transparent film 48 preferably contains a metal material.

Variation Examples

The description has so far discussed examples in which the configuration in accordance with Embodiment 1 described above additionally includes the electrically conductive transparent film 48. The scope of the present disclosure is however not limited to these examples. For example, the electrically conductive transparent film 48 may be added to the configuration of any one of Embodiments 2 to 4 described above.

Embodiment 6

The following will describe another embodiment of the disclosure. Note that for convenience of description, members of the present embodiment that have the same function as members of the preceding embodiment are indicated by the same or similar reference numerals, and description thereof is not repeated.

Figure 16:
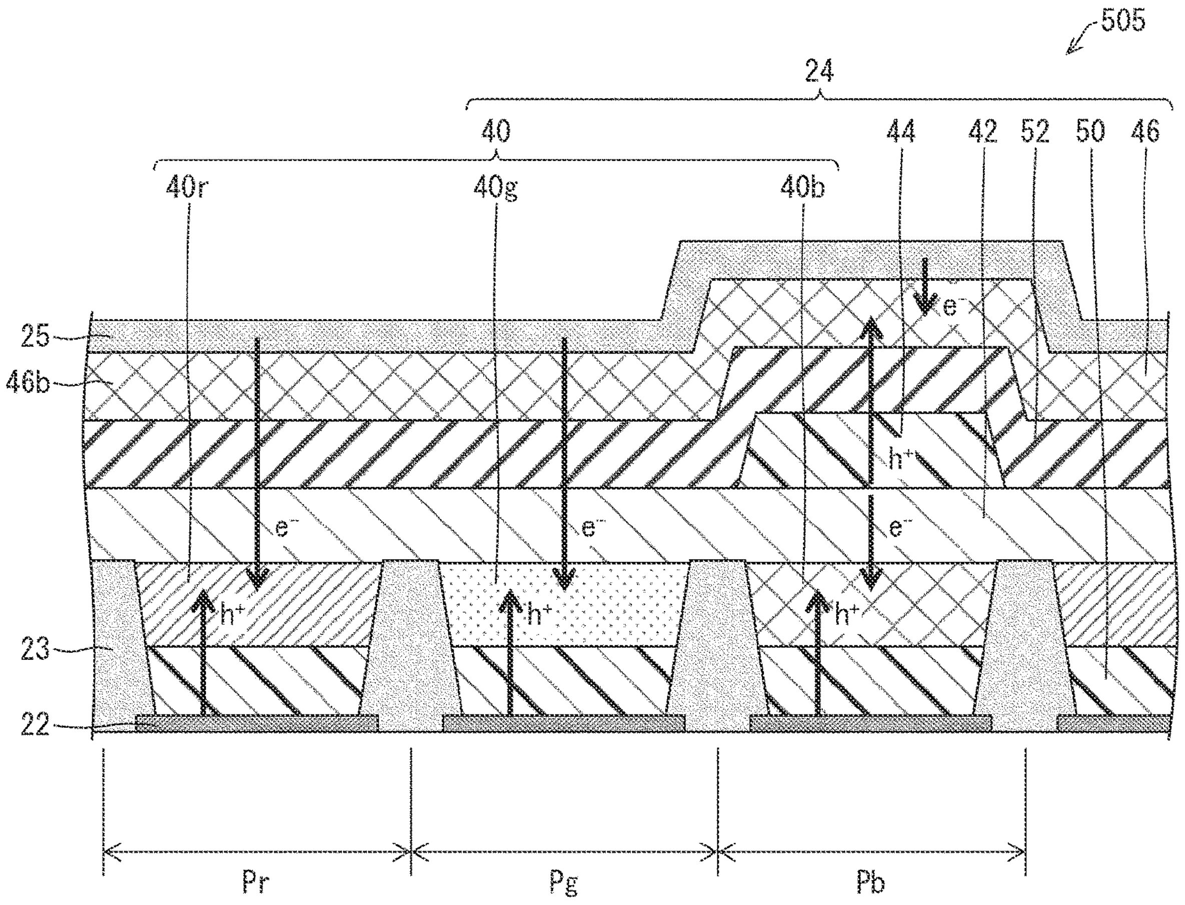
FIG. 16 is a schematic cross-sectional view of a non-limiting example of a structure of a light-emitting element layer in a display area in accordance with an embodiment of the present disclosure.

FIG. 16 is a schematic cross-sectional view of a non-limiting example of a structure of a light-emitting element layer 505 in the display area DA in accordance with the present embodiment. In the present embodiment, the pixel electrode 22 is an anode, the common electrode 25 is a cathode.

Referring to FIG. 16, the light-emitting element layer 505 in accordance with the present embodiment has the same structure as the light-emitting element layer 5 (see FIG. 4) in accordance with Embodiment 1 described above, except that the former additionally includes a hole transport layer 52.

The hole transport layer 52 is positioned between the second hole injection layer 44 and the second blue light-emitting layer 46*b*, has the same polarity as the pixel electrode 22, and is provided at least in the blue subpixel Pb. The hole transport layer 52 is preferably provided across the entire display area DA with a view to reducing patterning for improved productivity.

Note that in the configuration disclosed in Patent Literature 1, the charge transport layer positioned between the second blue light-emitting layer and the charge generation layer will not be formed across the entire display area. If the charge transport layer was formed in such a manner, recombination decreases in the red light-emitting layer and the green light-emitting layer and increases in the second blue light-emitting layer provided in the red pixels and the green pixels.

The hole transport layer 52 contains a hole transport material. The hole transport layer 52 is preferably sufficiently thin as to facilitate the injection of electrons from the common electrode 25 to the red light-emitting layer 40*r* and the green light-emitting layer 40*g*.

The material for the electroluminescent layer 24 is selected so that (i) a charge generation layer can be formed in the blue subpixels Pb, but that (ii) no charge generation layer is formed in the red subpixels Pr and the green subpixels Pg.

First of all, in the blue subpixel Pb, materials are selected for the electron injection layer 42, the second hole injection layer 44, and the hole transport layer 52 in such a manner that electrons can be easily withdrawn from the conduction band of the second hole injection layer 44 to the conduction band of the electron injection layer 42 and/or that electrons can be easily withdrawn from the valence band of the hole transport layer 52 to the conduction band of the second hole injection layer 44. Furthermore, materials are selected for the hole transport layer 52 and the second blue light-emitting layer 46*b* so that holes can also be easily supplied from the valence band of the hole transport layer 52 to the valence band of the second blue light-emitting layer 46*b*.

The withdrawal of electrons from the conduction band of the second hole injection layer 44 to the conduction band of the electron injection layer 42 is described in Embodiment 1 with reference to arrow A in FIG. 5, and the same description is not repeated here. The withdrawal of electrons from the valence band of the hole transport layer 52 to the conduction band of the second hole injection layer 44 is the same as the withdrawal of electrons from the valence band of the second blue light-emitting layer 46*b* to the conduction band of the second hole injection layer 44 (arrow B in FIG. 5) in Embodiment 1, and no detailed description is given here.

Then, the hole transport layer 52 receives holes from the second hole injection layer 44 to supply the holes to the valence band of the second blue light-emitting layer 46*b*. Therefore, the energy difference between the Fermi level of the hole transport layer 52 and the HOMO of the second blue light-emitting layer 46*b* is preferably sufficiently small as to facilitate the transport of holes from the hole transport layer 52 to the second blue light-emitting layer 46*b*.

In addition, the electron injection layer 42 receives electrons from the second hole injection layer 44 to inject the electrons to the conduction band of the first blue light-emitting layer 40*b*. Therefore, the energy difference between the Fermi level of the electron injection layer 42 and the LUMO of the first blue light-emitting layer 40*b* is preferably sufficiently small as to facilitate the injection of electrons from the electron injection layer 42 to the first blue light-emitting layer 40*b*.

As described in the foregoing, holes are injected from the second hole injection layer 44 to the hole transport layer 52, and holes are transported from the hole transport layer 52 to the second blue light-emitting layer 46*b*. Then, electrons are injected from the electron injection layer 42 to the first blue light-emitting layer 40*b*. Therefore, in the blue subpixel Pb, the combination of the electron injection layer 42 and the second hole injection layer 44 functions as a charge generation layer, enabling the second blue light-emitting layer 46*b* to emit light.

Secondly, in the red subpixel Pr and the green subpixel Pg, materials are selected for the hole transport layer 52 and the electron injection layer 42 so that electrons cannot be easily withdrawn from the valence band of the hole transport layer 52 to the conduction band of the electron injection layer 42. Specifically, these materials are selected so that (i) the Fermi level of the electron injection layer 42 is positioned between the vacuum energy level and the Fermi level of the hole transport layer 52 and also that (ii) the energy difference between the Fermi level of the electron injection layer 42 and the Fermi level of the hole transport layer 52 is sufficiently large. When this is the case, the energy barrier is so high that electrons are not so easily withdrawn as to produce holes in the valence band of the hole transport layer 52.

Therefore, the electron injection layer 42 does not inject holes to the hole transport layer 52, and the electrons injected from the common electrode 25 to the second blue light-emitting layer 46*b* are injected to the red light-emitting layer 40*r* or the green light-emitting layer 40*g* via the second blue light-emitting layer 46*b*, and the hole transport layer 52, and the electron injection layer 42. Therefore, in the red subpixel Pr and the green subpixel Pg, no charge generation layer is formed, which prohibits the second blue light-emitting layer 46*b* from emitting light.

Therefore, according to the configuration in accordance with the present embodiment, the same effects are achieved as the configuration in accordance with Embodiment 1 described above. In addition, the configuration in accordance with the present embodiment may be modified in the same manner as is the case with the configuration in accordance with Embodiment 1 described above.

Furthermore, in the configuration in accordance with the present embodiment, holes can be more easily transported from the second hole injection layer 44 to the second blue light-emitting layer 46*b* in the blue subpixel Pb than in the configuration in accordance with Embodiment 1 described above, because both the energy difference between the HOMO of the second hole injection layer 44 and the Fermi level of the hole transport layer 52 and the energy difference between the Fermi level of the hole transport layer 52 and the HOMO of the second blue light-emitting layer 46*b* are smaller than the energy difference between the HOMO of the second hole injection layer 44 and the HOMO of the second blue light-emitting layer 46*b*. Therefore, the efficiency of hole injection to the second blue light-emitting layer 46*b* is improved in the blue subpixel Pb. Therefore, the current consumption efficiency of the display device 2 is further improved.

Method of Manufacturing Light-Emitting Element Layer

Figure 17:
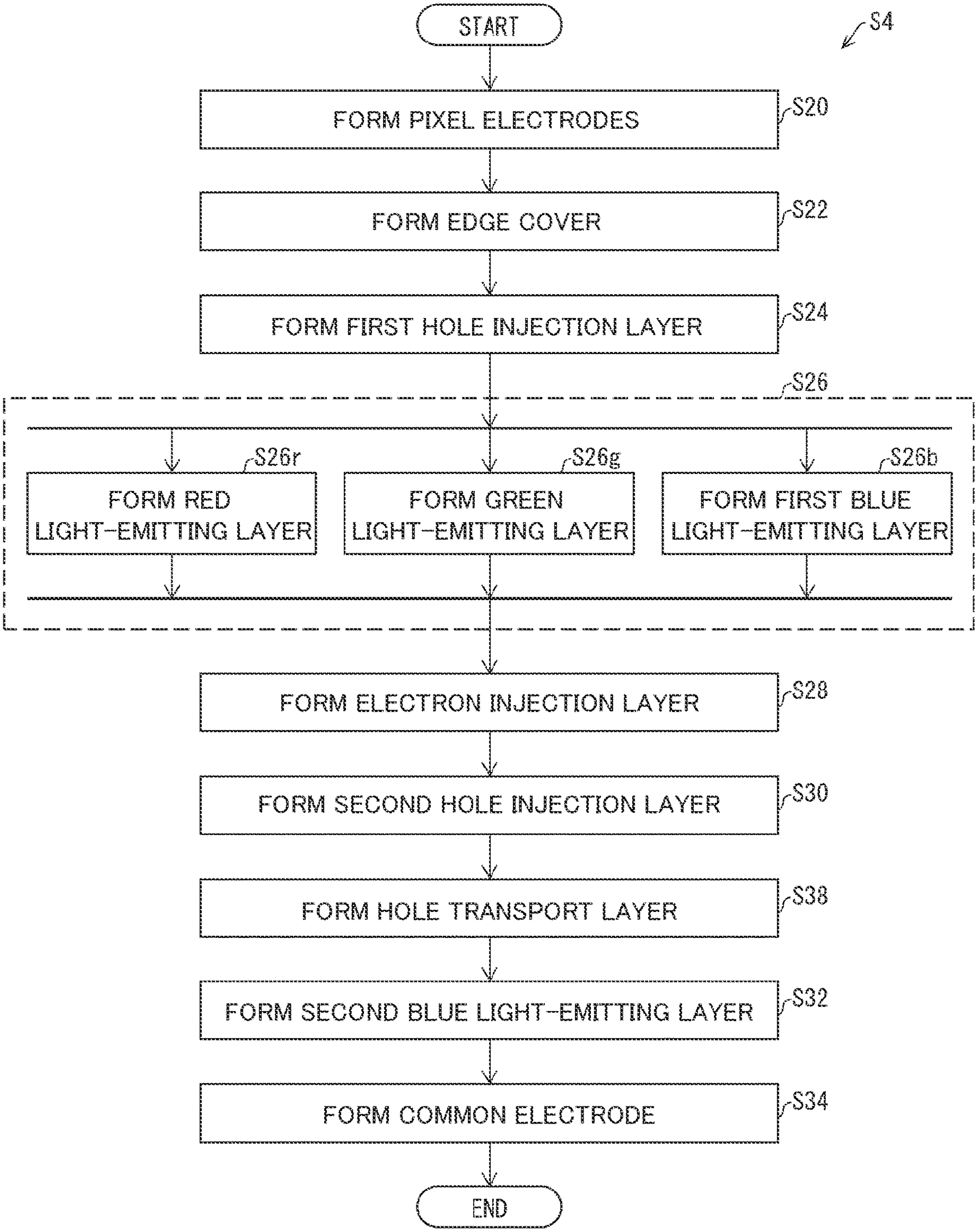
FIG. 17 is a schematic flow chart representing a non-limiting example of a method of manufacturing the light-emitting element layer shown in FIG. 16.

FIG. 17 is a schematic flow chart representing a non-limiting example of a method of manufacturing the light-emitting element layer 505 shown in FIG. 16.

Referring to FIG. 17, the method of manufacturing the light-emitting element layer 505 in accordance with the present embodiment can be provided by additionally including a step of forming the hole transport layer 52 (step S38)

between step S30 and step S32 of the method of manufacturing the light-emitting element layer 5 in accordance with Embodiment 1 described above. In step S38, the hole transport layer 52 is formed by, for example, vacuum vapor deposition using a common metal mask (CMM). Therefore, the hole transport layer 52 preferably contains a metal material.

Variation Examples

The description has so far discussed examples in which the configuration in accordance with Embodiment 1 described above additionally includes the hole transport layer 52. The scope of the present disclosure is however not limited to these examples. For example, an electron transport layer may be added to the configuration in accordance with Embodiment 2 described above, the electron transport layer being disposed between the electron injection layer 142 and the second blue light-emitting layer 46*b*, having the same polarity as the pixel electrode 122, and being provided at least in the blue subpixel Pb. For example, an electron transport layer may be added to the configuration in accordance with Embodiment 3 described above, the electron transport layer being disposed between the electron injection layer 142 and the second blue light-emitting layer 46*b*, having the same polarity as the common electrode 225, and being provided at least in the blue subpixel Pb. For example, a hole transport layer may be added to the configuration in accordance with Embodiment 4 described above, the hole transport layer being disposed between the second hole injection layer 44 and the second blue light-emitting layer 46*b*, having the same polarity as the common electrode 325, and being provided at least in the blue subpixel Pb.

Embodiment 7

The following will describe another embodiment of the disclosure. Note that for convenience of description, members of the present embodiment that have the same function as members of the preceding embodiment are indicated by the same or similar reference numerals, and description thereof is not repeated.

Figure 18:
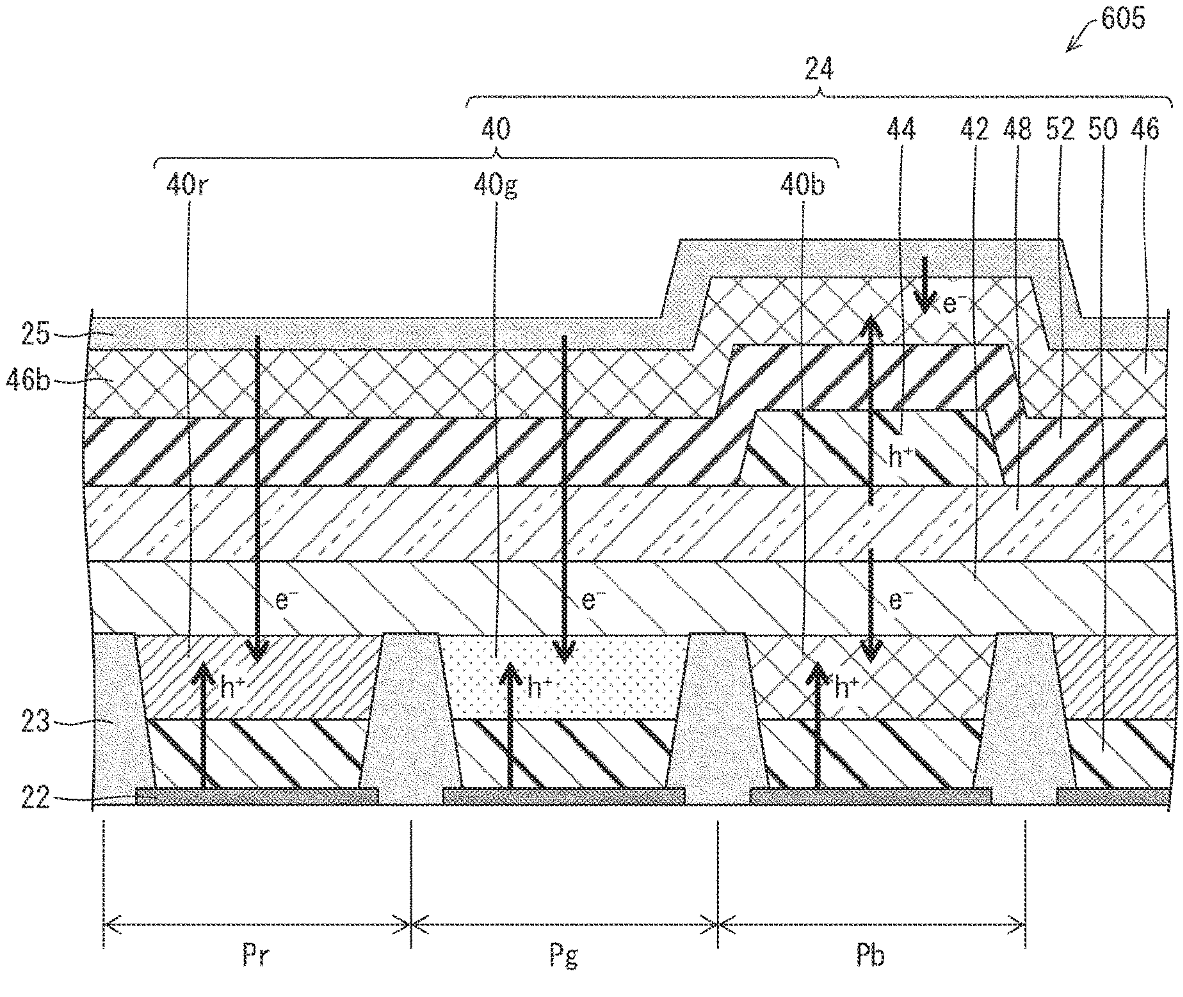
FIG. 18 is a schematic cross-sectional view of a non-limiting example of a structure of a light-emitting element layer in a display area in accordance with an embodiment of the present disclosure.

FIG. 18 is a schematic cross-sectional view of a non-limiting example of a structure of a light-emitting element layer 605 in the display area DA in accordance with the present embodiment. In the present embodiment, the pixel electrode 22 is an anode, and the common electrode 25 is a cathode.

Referring to FIG. 18, the light-emitting element layer 605 in accordance with the present embodiment has the same structure as the light-emitting element layer 5 in accordance with Embodiment 1 described above (see FIG. 4), except that the former additionally includes both the electrically conductive transparent film 48 and the hole transport layer 52.

The material for the electroluminescent layer 24 is selected so that (i) a charge generation layer can be formed in the blue subpixels Pb, but that (ii) no charge generation layer is formed in the red subpixels Pr and the green subpixels Pg.

First of all, in the blue subpixel Pb, materials are selected for the electrically conductive transparent film 48, the second hole injection layer 44, and the hole transport layer 52 in such a manner that electrons can be easily withdrawn from the conduction band of the second hole injection layer 44 to the conduction band of the electrically conductive transparent film 48 and/or electrons can be easily withdrawn from the valence band of the hole transport layer 52 to the conduction band of the second hole injection layer 44. Furthermore, materials are selected for the electrically conductive transparent film 48 and the electron injection layer 42 in such a manner that electrons can also be easily supplied from the conduction band of the electrically conductive transparent film 48 to the conduction band of the electron injection layer 42. In addition, materials are selected for the hole transport layer 52 and the second blue light-emitting layer 46*b* in such a manner that holes can also be easily supplied from the valence band of the hole transport layer 52 to the valence band of the second blue light-emitting layer 46*b*.

The withdrawal of electrons from the conduction band of the second hole injection layer 44 to the conduction band of the electrically conductive transparent film 48 is the same as the withdrawal of electrons from the conduction band of the second hole injection layer 44 to the conduction band of the electron injection layer 42 in Embodiment 1 described above (arrow A in FIG. 5), and no detailed description is given here. The withdrawal of electrons from the valence band of the hole transport layer 52 to the conduction band of the second hole injection layer 44 is the same as the withdrawal of electrons from the valence band of the second blue light-emitting layer 46*b* to the conduction band of the second hole injection layer 44 in Embodiment 1 described above (arrow B in FIG. 5), and no detailed description is given here.

Then, the hole transport layer 52 receives holes from the second hole injection layer 44 to supply the holes to the valence band of the second blue light-emitting layer 46*b*. Therefore, the energy difference between the Fermi level of the hole transport layer 52 and the HOMO of the second blue light-emitting layer 46*b* is preferably sufficiently small as to facilitate the transport of holes from the hole transport layer 52 to the second blue light-emitting layer 46*b*.

In addition, the electrically conductive transparent film 48 receives electrons from the second hole injection layer 44 to supply the electrons to the conduction band of the electron injection layer 42. Then, the electron injection layer 42 receives electrons from the electrically conductive transparent film 48 to inject the electrons to the conduction band of the first blue light-emitting layer 40*b*. Therefore, the energy difference between the Fermi level of the electrically conductive transparent film 48 and the Fermi level of the electron injection layer 42 is preferably sufficiently small, and also the energy difference between the Fermi level of the electron injection layer 42 and the LUMO of the first blue light-emitting layer 40*b* is preferably sufficiently small, as to facilitate the injection of electrons from the electrically conductive transparent film 48 to the electron injection layer 42 and the injection of electrons from the electron injection layer 42 to the first blue light-emitting layer 40*b*.

As described in the foregoing, holes are injected from the second hole injection layer 44 to the hole transport layer 52, and holes are transported from the hole transport layer 52 to the second blue light-emitting layer 46*b*. Then, electrons are injected from the electron injection layer 42 to the first blue light-emitting layer 40*b*. Therefore, in the blue subpixel Pb, the combination of the electron injection layer 42, the electrically conductive transparent film 48, and the second hole injection layer 44 functions as a charge generation layer, enabling the second blue light-emitting layer 46*b* to emit light.

Secondly, in the red subpixel Pr and the green subpixel Pg, materials are selected for the hole transport layer 52 and the electrically conductive transparent film 48 so that electrons cannot be easily withdrawn from the valence band of the hole transport layer 52 to the conduction band of the electrically conductive transparent film 48. Specifically, these materials are selected so that (i) the Fermi level of the electrically conductive transparent film 48 is positioned between the vacuum energy level and the Fermi level of the hole transport layer 52 and also that (ii) the energy difference between the Fermi level of the electrically conductive transparent film 48 and the Fermi level of the hole transport layer 52 is sufficiently large. When this is the case, the energy barrier is so high that electrons are not so easily withdrawn as to produce holes in the valence band of the hole transport layer 52. For example, the electrically conductive transparent film 48 may contain ITO, which has a work function of approximately −4.8 eV, and the hole transport layer 52 may contain α-NPD, in which the highest occupied molecular orbital (HOMO) has an energy level of approximately −5.4 eV.

Therefore, the electrically conductive transparent film 48 does not inject holes to the hole transport layer 52, and the electrons injected from the common electrode 25 to the second blue light-emitting layer **46*b* are injected to the red light-emitting layer 40*r* or the green light-emitting layer 40*g* via the second blue light-emitting layer 46*b* and the hole transport layer 52, the electrically conductive transparent film 48, and the electron injection layer 42. Therefore, in the red subpixel Pr and the green subpixel Pg, no charge generation layer is formed, which prohibits the second blue light-emitting layer 46*b*** from emitting light.

Therefore, according to the configuration in accordance with the present embodiment, the same effects are achieved as the configuration in accordance with Embodiment 1 described above. In addition, the configuration in accordance with the present embodiment may be modified in the same manner as is the case with the configuration in accordance with Embodiment 1 described above.

Furthermore, according to the configuration in accordance with the present embodiment, the current consumption efficiency of the display device 2 can be further improved, and the color mixing can be better prevented, similarly to Embodiment 5 described above. In addition, according to the configuration in accordance with the present embodiment, the current consumption efficiency of the display device 2 can be further improved similarly to the configuration in accordance with Embodiment 6 described above.

The invention claimed is:

1. A display device having a display area including a first pixel region, a second pixel region, and a third pixel region, the display device comprising:

a first electrode;

a first photoelectric conversion layer including a first light-emitting layer that emits light of a first color, a second light-emitting layer that emits light of a second color that differs from the first color, and a third light-emitting layer that emits light of a third color that differs from the first color and the second color;

a first electric charge injection layer having an opposite polarity from the first electrode;

a second electric charge injection layer having a same polarity as the first electrode;

a second photoelectric conversion layer including a fourth light-emitting layer that emits light of the third color; and a second electrode having an opposite polarity from the first electrode, wherein the first light-emitting layer is provided in the first pixel region, the second light-emitting layer is provided in the second pixel region, the third light-emitting layer is provided in the third pixel region, the first electric charge injection layer is provided across the entire display area, the second electric charge injection layer is provided only in the third pixel region, and the fourth light-emitting layer is provided at least in the third pixel region.

2. The display device according to claim 1, wherein the fourth light-emitting layer is provided across the entire display area.

3. The display device according to claim 1, wherein the second photoelectric conversion layer further includes a charge transport layer disposed between the second electric charge injection layer and the fourth light-emitting layer and having a same polarity as the second electric charge injection layer, and the charge transport layer is provided at least in the third pixel region.

4. The display device according to claim 3, wherein the charge transport layer is provided across the entire display area.

5. The display device according to claim 1, further comprising an electrically conductive transparent film between the first electric charge injection layer and the second electric charge injection layer, wherein the electrically conductive transparent film is provided at least in the first pixel region and the second pixel region.

6. The display device according to claim 5, wherein the electrically conductive transparent film is provided across the entire display area.

7. The display device according to claim 1, wherein either one of the first electrode and the second electrode includes a transparent electrode, and another one of the first electrode and the second electrode includes a reflective electrode.

8. The display device according to claim 1, wherein the first electrode and the second electrode each include a transparent electrode.

9. The display device according to claim 1, wherein the first light-emitting layer has an emission wavelength that differs from an absorption wavelength of the fourth light-emitting layer, and the second light-emitting layer has an emission wavelength that differs from the absorption wavelength of the fourth light-emitting layer.

10. The display device according to claim 1, wherein the third light-emitting layer has a luminous efficiency that is lower than a luminous efficiency of the first light-emitting layer and a luminous efficiency of the second light-emitting layer.

11. The display device according to claim 1, wherein the first electric charge injection layer contains a metal material.

12. The display device according to claim 1, wherein the second electric charge injection layer contains only an organic material.

13. The display device according to claim 1, wherein each layer from the first light-emitting layer to the fourth light-emitting layer contains quantum dots that emit light upon being excited by recombination of holes and electrons.

14. The display device according to claim 1, wherein each layer from the first light-emitting layer to the fourth light-emitting layer contains an organic material that emits light upon being excited by recombination of holes and electrons.

15. A method of manufacturing a display device having a display area including a first pixel region, a second pixel region, and a third pixel region, the method comprising:

a first electrode formation step of forming a first electrode;

a first photoelectric conversion layer formation step of forming a first photoelectric conversion layer including a first light-emitting layer that emits light of a first color, a second light-emitting layer that emits light of a second color that differs from the first color, and a third light-emitting layer that emits light of a third color that differs from the first color and the second color;

a first electric charge injection layer formation step of forming a first electric charge injection layer having an opposite polarity from the first electrode;

a second electric charge injection layer formation step of forming a second electric charge injection layer having a same polarity as the first electrode;

a second photoelectric conversion layer formation step of forming a second photoelectric conversion layer including a fourth light-emitting layer; and a second electrode formation step of forming a second electrode having an opposite polarity from the first electrode, wherein the first photoelectric conversion layer formation step provides the first light-emitting layer in the first pixel region, the second light-emitting layer in the second pixel region, and the third light-emitting layer in the third pixel region, the first electric charge injection layer formation step provides the first electric charge injection layer across the entire display area, the second electric charge injection layer formation step provides the second electric charge injection layer only in the third pixel region, and the second photoelectric conversion layer formation step provides the fourth light-emitting layer at least in the third pixel region.

* * * * *